(12) United States Patent
Maeda

(10) Patent No.: US 6,413,879 B1
(45) Date of Patent: Jul. 2, 2002

(54) METHOD FOR FORMING AN INTERLAYER INSULATING FILM, AND SEMICONDUCTOR DEVICE

(75) Inventor: Kazuo Maeda, Tokyo (JP)

(73) Assignees: Canon Sales Co., Inc.; Semiconductor Process Laboratory Co., Ltd., both of (JP)

(*) Notice: Subject to any disclaimer, the term of this patent is extended or adjusted under 35 U.S.C. 154(b) by 0 days.

(21) Appl. No.: 09/499,519

(22) Filed: Feb. 10, 2000

(30) Foreign Application Priority Data

Mar. 17, 1999 (JP) ............................................ 11-072252

(51) Int. Cl.[7] ............................................... H01L 21/31
(52) U.S. Cl. ........................ 438/758; 438/759; 438/760
(58) Field of Search ................................ 438/758, 760, 438/759

(56) References Cited

U.S. PATENT DOCUMENTS

| | | |
|---|---|---|
| 5,494,859 A | 2/1996 | Kapoor |
| 5,614,270 A | 3/1997 | Yeh et al. |
| 5,644,156 A * | 7/1997 | Suzuki ........................ 257/485 |
| 5,661,344 A | 8/1997 | Havemann et al. |
| 5,744,399 A | 4/1998 | Rostoker et al. |
| 6,030,706 A * | 2/2000 | Eissa ........................... 428/421 |

FOREIGN PATENT DOCUMENTS

| | | |
|---|---|---|
| EP | 849796 | 6/1998 |
| GB | 2313954 | 12/1997 |
| JP | 9-275103 | 10/1997 |
| WO | WO99/12196 | 3/1999 |

* cited by examiner

Primary Examiner—David Nelms
Assistant Examiner—Renee' R. Berry
(74) Attorney, Agent, or Firm—Lorusso & Loud

(57) ABSTRACT

A method for forming an interlayer insulating film is disclosed. This method comprises the steps of: forming an Si—C film or an Si—C—H film on an underlying insulating film by performing plasma polymerization for an Si and C containing compound; forming a porous $SiO_2$ film by performing O (oxygen) plasma oxidation for the Si—C film or the Si—C—H film; and forming a cover insulating film on the porous $SiO_2$ film by performing H (hydrogen) plasma treatment for the porous $SiO_2$ film.

19 Claims, 6 Drawing Sheets

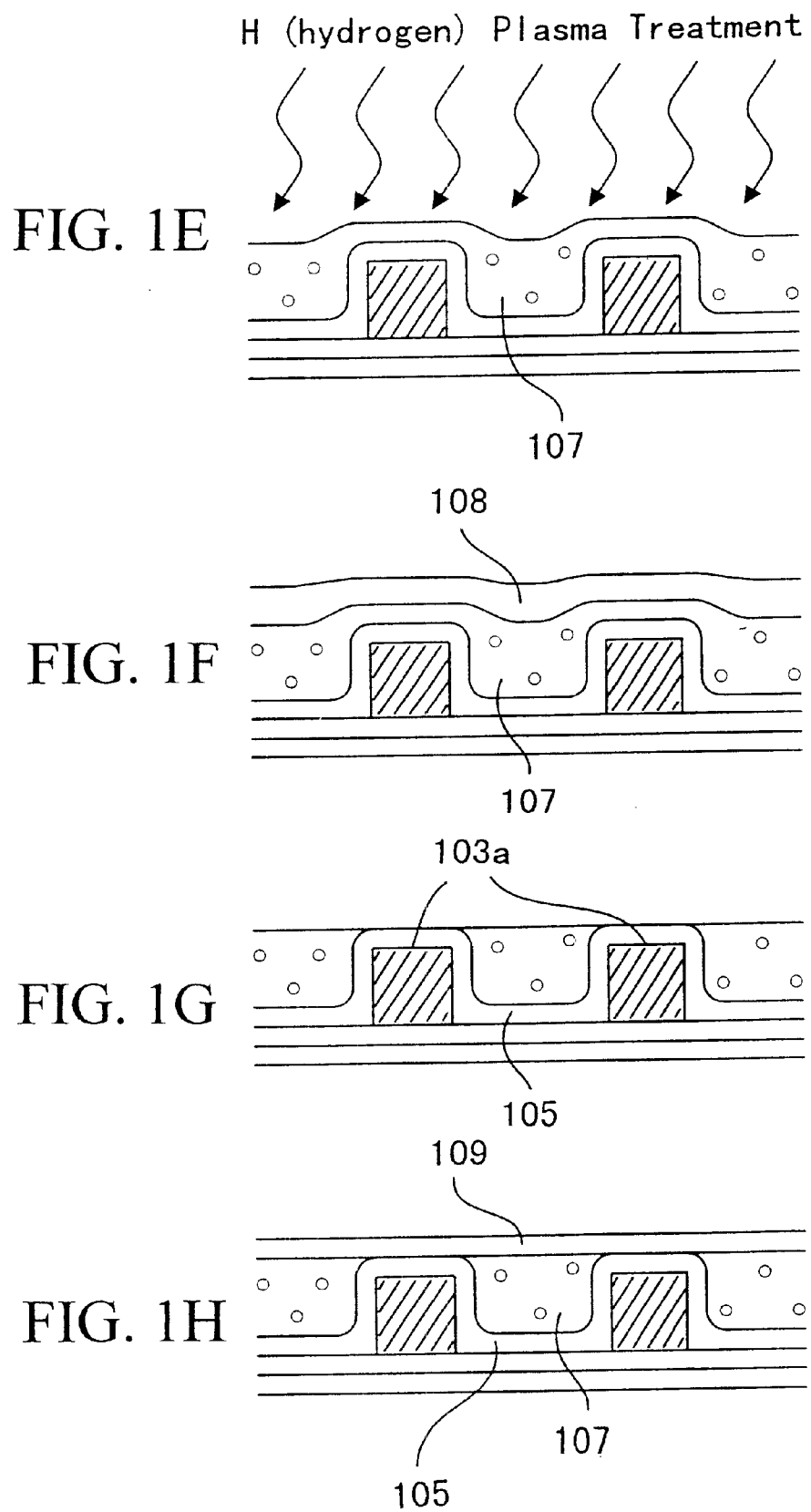

METHOD FOR FORMING AN INTERLAYER INSULATING FILM, AND SEMICONDUCTOR DEVICE

BACKGROUND OF THE INVENTION

The present invention relates to a method for forming an interlayer insulating film and, more particularly, to a method for forming an interlayer insulating film having a low dielectric constant, which is necessary for a highly-integrated semiconductor device. A progress in high integration regarding the semiconductor device in recent years has resulted in a narrower interval between wiring lines. As the narrowed interval between the wiring lines causes an increase in capacitance between the wiring lines, a request has been made for formation of an interlayer insulating film, which has a low dielectric constant.

With recent progresses in high integration of an LSI device, the wiring line has been micronized and multilayered. There has also been an increase in capacitance between the wiring lines. Such an increase in capacitance has caused a great reduction in an operating speed. Thus, improvement in this regard has been strongly demanded. As one of improvement measures, a method for reducing capacitance between the wiring lines has been studied. This method uses an interlayer insulating film, which has a dielectric constant lower than that of $SiO_2$ currently used for an interlayer insulating film.

Typical interlayer insulating films of low dielectric constants currently under study are ① an SiOF film, and ② an organic insulating film of a low dielectric constant. Description will now be made of these films.

① SiOF Film

An SiOF film is formed by using source gas containing F and substituting Si—F bond for a portion of Si—O bond in $SiO_2$. This SiOF film has a relative dielectric constant, which is monotonically reduced as concentration of F in the film increases.

For forming such SiOF films, several methods have been reported (see p.82 of monthly periodical "Semiconductor World", February issue of 1996). Most promising among these methods is one for forming an SiOF film by using $SiH_4$, $O_2$, Ar and $SiF_4$ as source gases, and by a high-density plasma enhanced CVD method (HDPCVD method). A relative dielectric constant of an SiOF film formed by this method is in a range of 3.1 to 4.0 (varies depending on F concentration in the film). This value is lower than a relative dielectric constant 4.0 of $SiO_2$, which has conventionally been used for the interlayer insulating film.

② Organic Insulating Film of Low Dielectric Constant

As an insulating film which has a lower dielectric constant (3.0 or lower) compared with the SiOF film, an organic insulating film of a low dielectric constant is now a focus of attention. Table 1 shows a few organic insulating films of low dielectric constants, which have been reported, and respective relative dielectric constants and thermal decomposition temperatures thereof.

TABLE 1

| Organic Insulating Film | Relative Dielectric Constant | Thermal Decomposition Temperature (° C.) | Note |
|---|---|---|---|
| Fluorine-containing resin | 2.4 | 420 | p. 82 of monthly periodical "Semiconductor World", February issue of 1997 |
| Cytop | 2.1 | 400 | p. 90 of monthly periodical "Semiconductor World", February issue of 1996 |
| Amorphous telon | 1.9 | 400 | p. 91 of monthly periodical "Semiconductor World", February issue of 1996 |

However, the SiOF film is disadvantageous in that an increase in concentration of F in the film leads to a reduction in moisture absorption resistance. The reduced moisture absorption resistance poses a serious problem, because a transistor characteristic and adhesion of an upper barrier metal layer are affected.

Peeling-off easily occurs in the organic insulating film of a low dielectric constant, because of bad adhesion with a silicon wafer or the $SiO_2$ film. Furthermore, the organic insulating film is disadvantageous in that heat resistivity is low since a thermal decomposition temperature is around 400° C. The disadvantage of low heat resistivity poses a problem for annealing a wafer at a high temperature.

SUMMARY OF THE INVENTION

It is an object of the present invention to provide a method for forming an interlayer insulating film of a low dielectric constant, which has good moisture absorption resistance and heat resistivity. It is another object of the invention to provide a semiconductor device, which employs the above method.

Description will now be made of an interlayer insulating film of the present invention by referring to Table 2.

TABLE 2

| Porous Film | Source Gas | Film by Plasma Polymerization |
|---|---|---|
| $SiO_2$ film | TEOS | Si—C film |
| | | Si—C—H film |
| | TEOS + $O_2$ | Si—C—O film |
| | | Si—C—O—H film |
| | TEOS + $H_2O$ | Si—C—O—H film |
| B-containing $SiO_2$ film | TEOS + $B_2H_6$ | Si—C—B film |
| | | Si—C—B—H film |
| | TEOS + $B_2H_6$ + $O_2$ | Si—C—B—O film |
| | | Si—C—B—O—H film |
| | TEOS + $B_2H_6$ + $H_2O$ | Si—C—B—O—H film |
| F-containing $SiO_2$ film | TEOS + $C_2F_6$ | Si—C—F film |
| | | Si—C—F—H film |
| | TEOS + $C_2F_6$ + $O_2$ | Si—C—F—O film |
| | | Si—C—F—O—H film |
| | TEOS + $C_2F_6$ + $H_2O$ | Si—C—F—O—H film |

For formation of a porous $SiO_2$ film of the present invention, TEOS, TEOS+$O_2$ or TEOS+$H_2O$ is used as source gas. By performing plasma polymerization for such source gas, an Si—C film, an Si—C—H film, an Si—C—O film or an Si—C—O—H film is formed on a formed body. Then, by performing O (oxygen) plasma treatment for these films, C or H is oxidized in the film. C or H is oxidized in the film, and voids are formed in portions from which C or H has been discharged. Accordingly, a porous $SiO_2$ film is formed. A porous $SiO_2$ film can also be formed by using methylsilane ($Si(CH_3)H_3$), instead of TEOS.

For formation of a porous B(boron)-containing $SiO_2$ film of the present invention, TEOS+$B_2H_6$, TEOS+$B_2H_6$+$O_2$ or TEOS+$B_2H_6$+$H_2O$ is used as source gas. By performing plasma polymerization for such source gas, an Si—C—B film, an Si—C—B—H film, an Si—C—B—O film or an Si—C—B—O—H film is formed on a formed body. Then, by performing O (oxygen) plasma treatment for these films, C or H is oxidized in the film. C or H is oxidized in the film, and voids are formed in portions from which C or H has been discharged. Accordingly, a porous B-containing $SiO_2$ film is formed. A porous B-containing $SiO_2$ film can also be formed by using methylsilane ($Si(CH_3)H_3$) or trimethyl-siliruborate ($\{(CH_3)_3SiO\}_3B$), instead of TEOS in source gas. Instead of $B_2H_6$ in source gas, TMB(B(OCH$_3$)) or TEB(B(OC$_2$H$_5$)$_3$) can be used to form a porous B-containing $SiO_2$ film.

For formation of a porous F-containing $SiO_2$ film of the present invention, TEOS+$C_2F_6$, TEOS+$C_2F_6$+$O_2$ or TEOS+$C_2F_6$+$H_2O$ is used as source gas. By performing plasma polymerization for such source gas, an Si—C—F film, an Si—C—F—H film, an Si—C—F—O film or an Si—C—F—O—H film is formed on an object to be formed. Then, by performing O (oxygen) plasma treatment for there films, C or H is oxidized in the film. C or H is oxidized in the film, voids are formed in portions from which C or H has been discharged. Accordingly, a porous F-containing $SiO_2$ film is formed. A porous F-containing $SiO_2$ film can also be formed by using methylsilane ($Si(CH_3)H_3$), instead of TEOS.

BRIEF DESCRIPTION OF THE DRAWINGS

FIGS. 1A to 1H are cross-sectional views respectively showing methods for forming interlayer insulating films according to 1st, 3rd, 5th, 7th, 9th, 11th and 13th embodiments of the preset invention.

DESCRIPTION OF THE PREFERRED EMBODIMENTS

Next, description will be made of the preferred embodiments of the present invention with reference to the accompanying drawings.

First Embodiment

FIGS. 1A to 1H are cross-sectional views illustrating a first embodiment of the present invention.

Figure 1A:
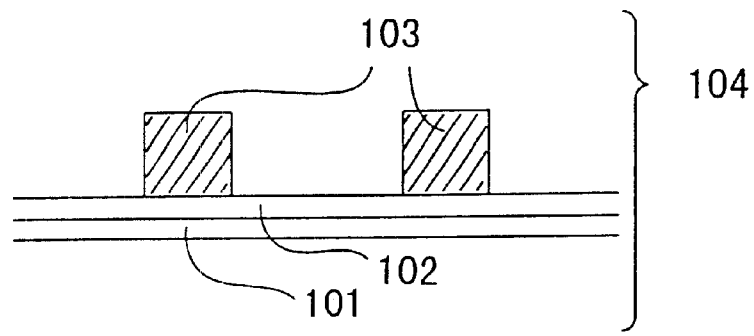

First, as shown in FIG. 1A, a BPSG (borophosphosilicate glass) film 102 is formed on a silicon substrate 101. Then, after an aluminum film is formed on the BPSG film 102, an aluminum wiring layer 103 is formed by patterning the aluminum film. The silicon substrate 101, the BPSG film 102 and the aluminum wiring layer 103 formed in this manner constitute an object 104 to be formed.

Figure 1B:
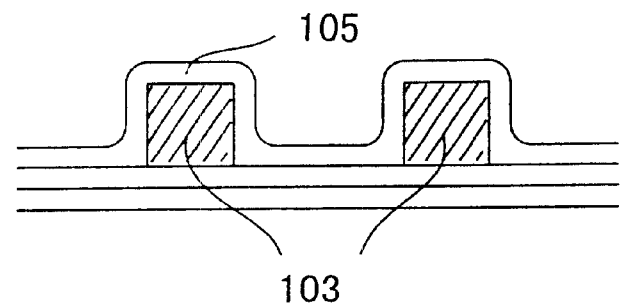

Then, as shown in FIG. 1B, an $SiO_2$ film 105 (underlying insulating film) is formed on the object 104 to be formed. This $SiO_2$ film 105 is formed by a plasma enhanced CVD method (plasma enhanced chemical vapor deposition method), and $SiH_4$ and $N_2O$ are used as source gases. A film thickness of this $SiO_2$ film 105 is 100 nm. This $SiO_2$ film 105 can prevent $H_2O$ from being dispersed in the aluminum wiring layer 103, which may cause corrosion.

Figure 1C:
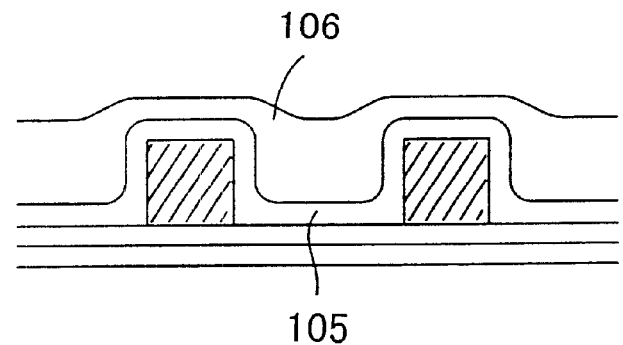

Subsequently, as shown in FIG. 1C, a carbon or carbon and hydrogen containing (referred to as Si—C (—H), hereinafter) film 106 is formed on the $SiO_2$ film 105 (underlying insulating film). This Si—C (—H) film 106 is formed by using 50 sccm TEOS (Tetra-Ethyl-Ortho-Silicate) as source gas, applying an RF power having a frequency of 13.56 MHz and a power of 100 W while keeping the silicon substrate 101 at 100° C., and performing plasma polymerization for TEOS at pressure of 1 Torr. A film thickness of this Si—C (—H) film 106 is 500 nm. It should be noted that, in forming the Si—C (—H) film 106, one of metylsilane ($Si(CH_3)H_3$) and trimethysililbotrate ($\{(CH_3)_3SiO\}_3B$) can also be used instead of the TEOS. When using one of these gases, the flow rate of the gas is 50 sccm and other process conditions are the same as in the case using the TEOS. Using the trimethysililbotrate, the Si—C (—H) film 106 further contains B (boron).

Figure 1D:
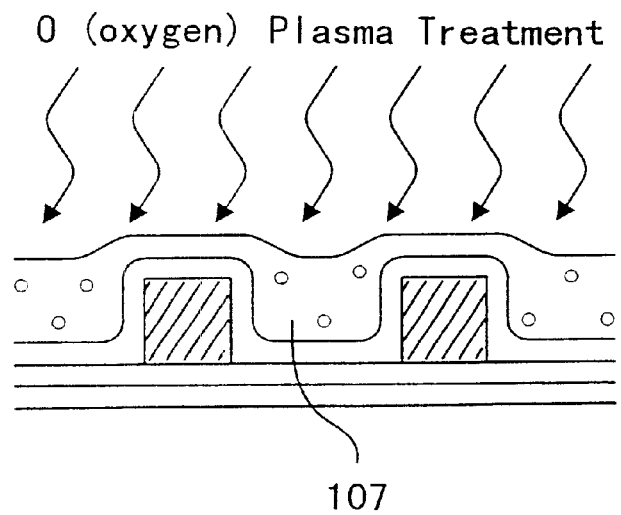

Then, as shown in FIG. 1D, O (oxygen) plasma treatment is performed for the Si—C (—H) film 106. This O (oxygen) plasma treatment is performed supplying 600 sccm $O_2$ to a chamber (not shown) and applying RF power having frequency of 400 kHz and power of 300 W to the $O_2$. The time for the O (oxygen) plasma treatment is 360 sec, and the temperature of the silicon substrate 101 is maintained at 350° C. during undergoing the O (oxygen) plasma treatment.

In this O (oxygen) plasma treatment C or H contained in the Si—C (—H) film 106 is oxidized, and discharged to the outside of the film. Voids are formed in portions from which C or H has been discharged, and Si—O bond is formed in the portions. Thus, the Si—C (—H) film 106 becomes a porous $SiO_2$ film 107.

Subsequently, as shown in FIG. 1E, H (hydrogen) plasma treatment is performed for the porous $SiO_2$ film 107.

This H plasma treatment is performed by supplying $H_2$ of 600 sccm to a chamber (not shown) and applying RF power to upper and lower electrodes (not shown) that is opposing each other in the chamber. And the RF power applied to the upper electrode has frequency of 13.56 MHz and power of 50 W. On the other hand, the RF power applied to the lower electrode has frequency of 400 kHz and power of 400 W. Further, during undergoing the H plasma treatment, the pressure in the chamber is 0.1~0.2 Torr and the temperature of the silicon substrate 101 is maintained at 400° C. Still further, the time for the H plasma treatment is 60 sec.

The H plasma treatment substitutes Si—H bonds for dangling bonds of Si in an Si—O bond in the surface of the void. Therefore, OH radicals and water are made to be hard to bond to the dangling bonds of Si, which improves the moisture absorption resistance of the film.

Subsequently, as shown in FIG. 1F, an $SiO_2$ film 108 is formed on the porous $SiO_2$ film 107. This $SiO_2$ film 108 is formed by a CVD method, which contains TEOS and $O_3$ as source gases. $O_3$ contained as source gas has concentration enough for oxidation of TEOS. Accordingly, the $SiO_2$ film 108 shows flowability, and can be planarized to a considerable extent.

Then, as shown in FIG. 1G, the $SiO_2$ film 108 is polished by a CMP method (chemical mechanical polishing method) to planarize its surface. At this time, some portions of the previously formed $SiO_2$ films 105 and 107 are eliminated by polishing. The planarization by the CMP method should be carried out to prevent complete elimination of the $SiO_2$ film 105 formed on a convexity 103a of the aluminum wiring layer.

Subsequently, as shown in FIG. 1H, an $SiO_2$ film 109 (cover insulating layer) is formed on the planarized surface. This $SiO_2$ film 109 is formed by a plasma enhanced CVD method, and $SiH_4$ and $N_2O$ are used as source gases. A film thickness of this $SiO_2$ film 109 is 100 nm.

The foregoing process of forming the $SiO_2$ film 105 (underlying insulating film), 107 and 109 (cover insulating film) results in formation, on the object 104 to be formed, of an interlayer insulating film of a low dielectric constant, which has good heat resistivity and moisture absorption resistance. That is, since the $SiO_2$ film 107 has porosity, a relative dielectric constant thereof is smaller than that of a usual $SiO_2$ film. Also, since the usual $SiO_2$ film 109 is formed on the porous $SiO_2$ film 107, incursion of water into the $SiO_2$ film 107 can be prevented. Furthermore, performing the H plasma treatment for the $SiO_2$ film 107 can improve the moisture absorption resistance of the film. Moreover, the $SiO_2$ films 105, 107 and 109 have better heat resistivity compared with the organic insulating film since these films consist mainly of Si and O.

Second Embodiment

A second embodiment is a case of applying the first embodiment to a damascene process.

FIGS. 2A to 2M are cross-sectional views illustrating the second embodiment.

Figure 2A:
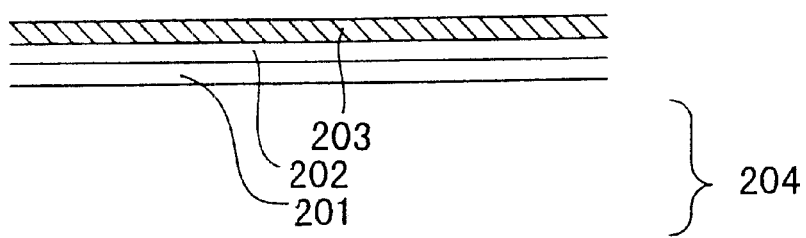
FIGS. 2A to 2M are cross-sectional view respectively showing methods for forming interlayer insulating films according to 2nd, 4th, 6th, 8th, 10th, 12th and 14th embodiments of the invention.

First, as shown in FIG. 2A, a BPSG (borophosphosilicate glass) film 202 is formed on a silicon substrate 201. After an aluminum layer is formed on the BPSG film 202 an aluminum wiring layer 203 is formed by patterning the aluminum layer. It should be noted that the aluminum wiring layer 203 in figures is not patterned for convenience. Then, the silicon substrate 201, the BPSG film 202 and the aluminum wiring layer 203 constitute an object 204 to be formed.

Figure 2B:
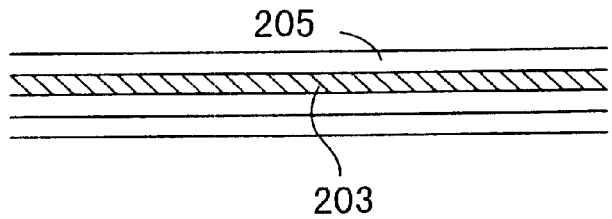

Then, as shown in FIG. 2B, an $SiO_2$ film 205 (underlying insulating film) having a film thickness of 100 mn is formed on the aluminum wiring layer 203. This $SiO_2$ film 205 is formed by a plasma enhanced CVD method (plasma enhanced chemical vapor deposition method), and $SiH_4$ and $N_2O$ are used as source gases.

Figure 2C:
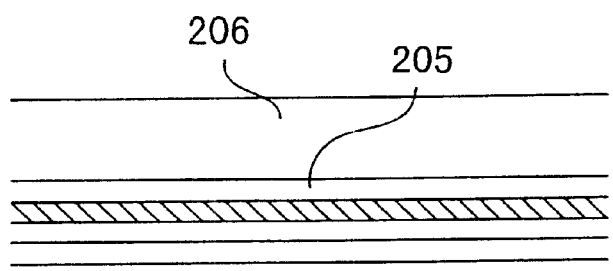

Subsequently, as shown in FIG. 2C, an Si—C (—H) film 206 is formed on the $SiO_2$ film 205 (underlying insulating film). This Si—C (—H) film 206 is formed by using 50 sccm TEOS (Tetra-Ethyl-Ortho-Silicate) as source gas, applying an RF power having a frequency of 13.56 MHz and a power of 100 W while keeping the silicon substrate 201 at 100° C., and performing plasma polymerization for TEOS at pressure of 1 Torr. A film thickness of the Si—C (—H) film 206 is 500 nm. It should be noted that, in forming the Si—C (—H) film 206, one of metylsilane ($Si(CH_3)H_3$) and trimethysililbotrate ($\{(CH_3)_3SiO\}_3B$) can also be used instead of the TEOS. When using one of these gases, the flow rate of the gas is 50 sccm and other process conditions are the same as in the case using the TEOS. Using the trimethysililbotrate, the Si—C (—H) film 206 further contains B (boron).

Figure 2D:
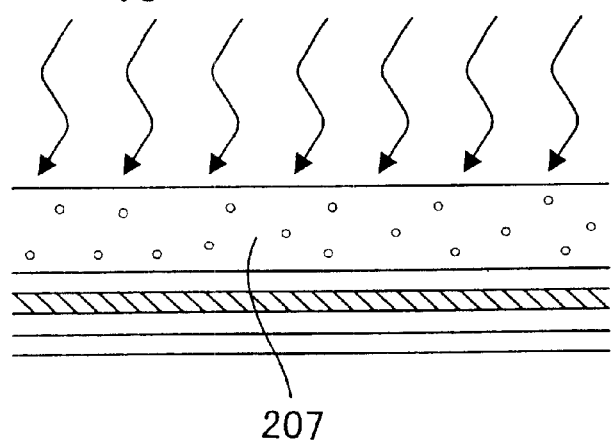

Then, as shown in FIG. 2D, O (oxygen) plasma treatment is performed for the Si—C (—H) film 206. This O (oxygen) plasma treatment is performed supplying 600 sccm $O_2$ to a chamber (not shown) and applying RF power having frequency of 400 kHz and power of 300 W to the $O_2$. The time for the O (oxygen) plasma treatment is 360 sec, and the temperature of the silicon substrate 201 is maintained at 350° C. during undergoing the O (oxygen) plasma treatment..

In this O (oxygen) plasma treatment C or H contained in the Si—C (—H) film 206 is then oxidized, and discharged to the outside of the film. Voids are formed in portions, from which C or H has been discharged, and Si—O bond is formed on the portions. Accordingly, the Si—C (—H) film 206 becomes a porous $SiO_2$ film 207.

Figure 2E:
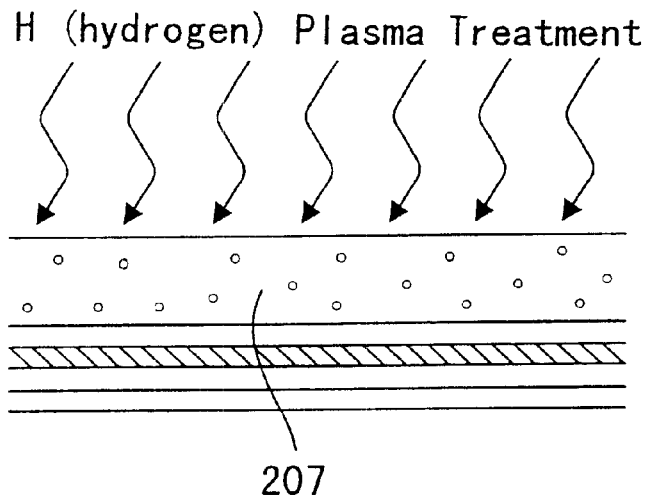

Subsequently, as shown in FIG. 2E, H (hydrogen) plasma treatment is performed for the porous $SiO_2$ film 207.

This H plasma treatment is performed by supplying $H_2$ of 600 sccm to a chamber (not shown) and applying RF power to upper and lower electrodes (not shown) that is opposing each other in the chamber. And the RF power applied to the upper electrode has frequency of 13.56 MHz and power of 50 W. On the other hand, the RF power applied to the lower electrode has frequency of 400 kHz and power of 400 W. Further, during undergoing the H plasma treatment, the pressure in the chamber is 0.1~0.2 Torr and the temperature of the silicon substrate 201 is maintained at 400° C. Still further, the time for the H plasma treatment is 60 sec.

The H plasma treatment substitutes Si—H bonds for dangling bonds of Si in an Si—O bond in the surface of the void. Therefore, OH radicals and water are made to be hard to bond to the dangling bonds of Si, which improves the moisture absorption resistance of the film.

Figure 2F:
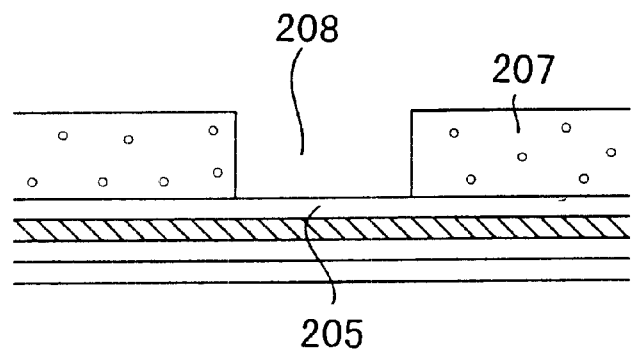

Subsequently, as shown in FIG. 2F, a damascene trench 208 is formed by patterning the $SiO_2$ film 207. This damascene trench 208 reaches the $SiO_2$ film 205, which has been formed below the $SiO_2$ film 207.

Figure 2G:
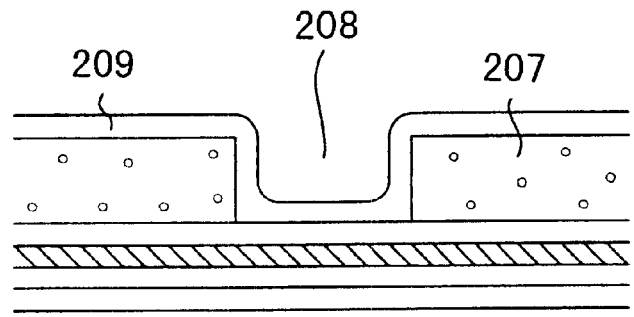

Then, as shown in FIG. 2G, an $SiO_2$ film 209 (first insulating film) is formed on the $SiO_2$ film 207 and on the side and bottom portions of the damascene trench 208. This $SiO_2$ film 209 is formed by a plasma enhanced CVD method, and $SiH_4$ and $N_2O$ are used as source gases. By the $SiO_2$ film 209 formed in the side portion of the damascene trench 208, Cu buried later in the damascene trench 208 can be prevented from being dispersed inside the porous $SiO_2$ film 207.

Figure 2H:
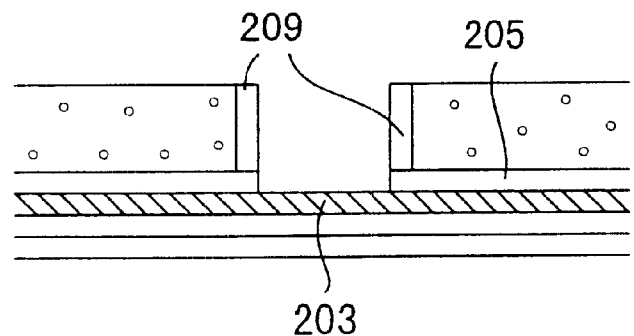

Then, as shown in FIG. 2H, anisotropic etching is performed for the $SiO_2$ film 209 (first insulating film) and the $SiO_2$ film 205 (underlying insulating film) formed on the bottom portion of the damascene trench 208. Accordingly, the $SiO_2$ film 209 is eliminated except for a portion formed on the side portion of the damascene trench 208. Also, since the $SiO_2$ film 205 formed below the damascene trench 208 is eliminated, a contact hole that reaches the aluminum wiring layer 203is formed below the damascene trench 208.

Figure 2I:
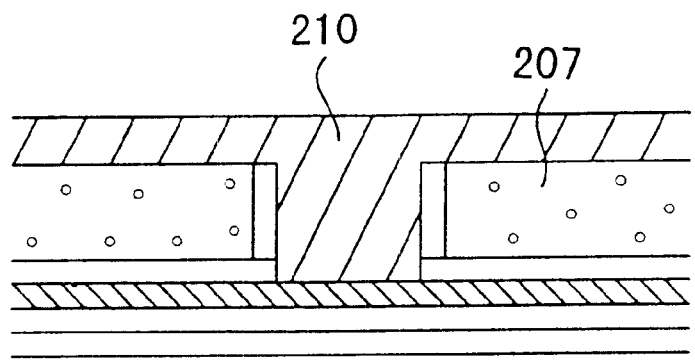

Subsequently, as shown in FIG. 2I, a Cu-plated film 210 is formed in the damascene trench 208 and on the $SiO_2$ film 207. The Cu-plated film 210 formed in the damascene trench 208 is used as a Cu wiring line.

Figure 2J:
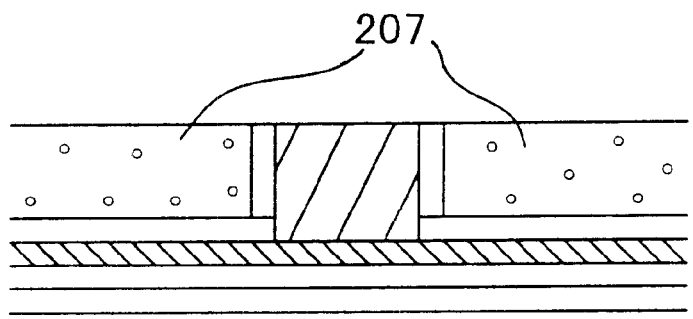

Then, as shown in FIG. 2J, the Cu-plated film 210 formed on the $SiO_2$ film 207 is polished by a CMP method to be eliminated. Accordingly, the Cu-plated film remains only in the damascene trench 208.

Figure 2K:
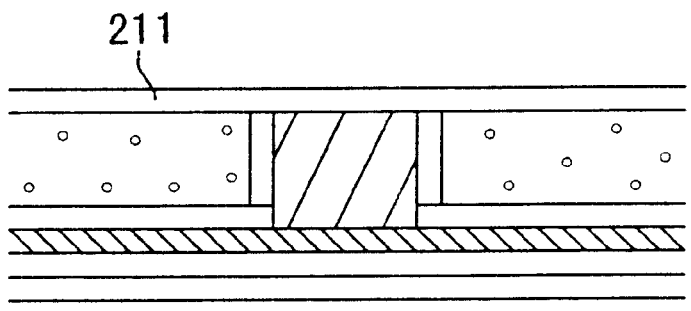

Subsequently, as shown in FIG. 2K, a barrier metal TiN film 211 is formed above the damascene trench 208. Accordingly, Cu in the damascene trench 208 can be prevented from being dispersed in an $SiO_2$ film formed later above the damascene trench 208.

Figure 2L:
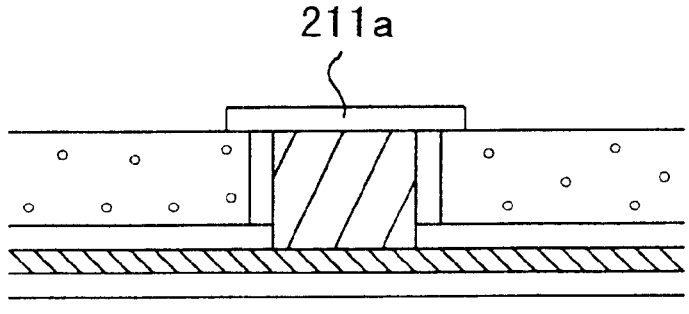

Then, as shown in FIG. 2L, patterning is performed for the TiN film 211 to leave a TiN film 211a formed above the damascene trench 208, and the TiN film 211 formed in the other portions is etched to be eliminated.

Figure 2M:
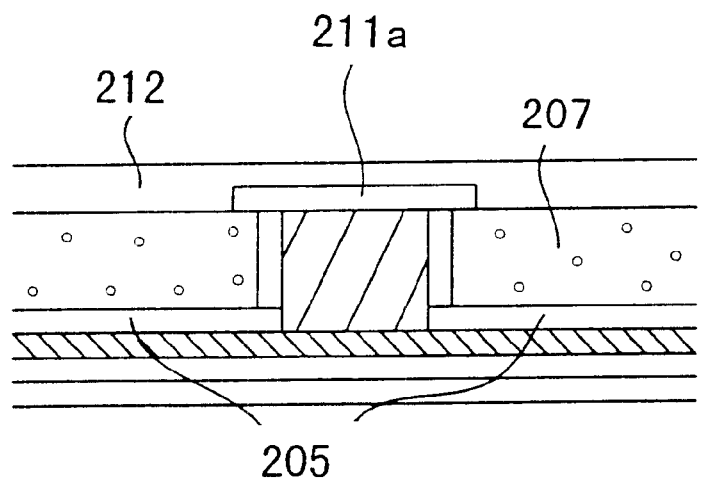

Subsequently, as shown in FIG. 2M, an $SiO_2$ film 212 (cover insulating film) is formed on the $SiO_2$ film 207 and the TiN film 211a. This $SiO_2$ film 212 is formed by a plasma enhanced CVD method, and $SiH_4$ and $N_2O$ are used as source gases.

The foregoing process results in formation, on the object 204 to be formed, of an interlayer insulating film of a low dielectric constant, which has good heat resistivity and moisture absorption resistance. That is, since the $SiO_2$ film 207 has porosity, a relative dielectric constant thereof is smaller than that of a usual $SiO_2$ film. Also, since the usual $SiO_2$ film 212 (cover insulating film) is formed on the porous SiO$_2$ film 207, incursion of water into the SiO$_2$ film 207 can be prevented. Furthermore, performing the H plasma treatment for the SiO$_2$ film 207 can improve the moisture absorption resistance of the film. Moreover, the SiO$_2$ films 207 and 212 have better heat resistivity compared with the organic insulating film since these films consist mainly of Si and O.

Third Embodiment

FIGS. 1A to 1H are cross-sectional views illustrating a third embodiment.

First, as shown in FIG. 1A, a BPSG (borophosphosilicate glass) film 107 is formed on a silicon substrate 101. Then, after an aluminum film is formed on the BPSG film 102, patterning is performed for the same to form an aluminum wiring layer 103. The silicon substrate 101, the BPSG film 102 and the aluminum wiring layer 103 formed in this manner constitute an object 104 to be formed.

Then, as shown in FIG. 1B, an SiO$_2$ film 105 (underlying insulating film) is formed on the object 104 to be formed. This SiO$_2$ film 105 is formed by a plasma enhanced CVD method (plasma enhanced chemical vapor deposition method), and SiH$_4$ and N$_2$O are used as source gases. A film thickness of the SiO$_2$ film 105 is 100 nm. The SiO$_2$ film 105 can prevent H$_2$O from being dispersed in the aluminum wiring layer 103, which may cause corrosion.

Subsequently, as shown in FIG. 1C, a carbon or a carbon and hydrogen containing (referred to as Si—C (—H), hereinafter) film 106 is formed on the SiO$_2$ film 105 (underlying insulating film). This Si—C (—H) film 106 is formed by using SiH$_4$ and H$_2$O as source gases, applying an RF power having a frequency of 13.56 MHz and power of 300 W while keeping the silicon substrate 101 at 100° C., and performing plasma polymerization for SiH$_4$ and H$_2$O at pressure of 1 Torr. At this time, flow rates of the source gases are 30 sccm and 60 sccm for SiH$_4$ and H$_2$O respectively. A film thickness of the Si—C (—H) film 106 is 500 nm.

It should be noted that in forming Si—C (—H) film 106 the metylsilane (Si(CH$_3$)H$_3$) can also be used instead of the SiH$_4$. When using the metylsilane (Si(CH$_3$)H$_3$) its flow rate is 30 sccn and the power of the RF power is 100 W, and the other process conditions are the same as in the case using the SiH$_4$.

Then, as shown in FIG. 1D, O (oxygen) plasma treatment is performed for the Si—C (—H) film 106. This O (oxygen) plasma treatment is performed supplying 600 sccm O$_2$ to a chamber (not shown) and applying RF power having frequency of 400 kHz and power of 300 W to the O$_2$. The time for the O (oxygen) plasma treatment is 360 sec, and the temperature of the silicon substrate 101 is maintained at 350° C. during undergoing the O (oxygen) plasma treatment.

In this O (oxygen) plasma treatment C or H contained in the Si—C (—H) film 106 is oxidized and discharged to the outside of the film. Voids are formed in portions, from which C or H has been discharged, and Si—O bond is formed on the portion. Accordingly, the Si—C (—H) film 106 becomes a porous SiO$_2$ film 107.

Subsequently, as shown in FIG. 1E, H (hydrogen) plasma treatment is performed for the porous SiO$_2$ film 107.

This H plasma treatment is performed by supplying H$_2$ of 600 sccm to a chamber (not shown) and applying RF power to upper and lower electrodes (not shown) that is opposing each other in the chamber. And the RF power applied to the upper electrode has frequency of 13.56 MHz and power of 50 W. On the other hand, the RF power applied to the lower electrode has frequency of 400 kHz and power of 400 W. Further, during undergoing the H plasma treatment, the pressure in the chamber is 0.1~0.2 Torr and the temperature of the silicon substrate 101 is maintained at 400° C. Still further, the time for the H plasma treatment is 60 sec.

The H plasma treatment substitutes Si—H bonds for dangling bonds of Si in an Si—O bond in the surface of the void. Therefore, OH radicals and water are made to be hard to bond to the dangling bonds of Si, which improves the moisture absorption resistance of the film.

Subsequently, as shown in FIG. 1F, an SiO$_2$ film 108 is formed on the porous SiO$_2$ film 107. This SiO$_2$ film 108 is formed by a CVD method, which employs source gas containing TEOS and O$_3$. In this case, since O$_3$ in source gas has concentration enough for oxidation of TEOS, the SiO$_2$ film 108 shows flowability, and can be planarized to a considerable extent.

Then, as shown in FIG. 1G, the SiO$_2$ film 108 is polished by a CMP method (chemical mechanical polishing method) so as to planarize its surface. At this time, some portions of the previously formed SiO$_2$ films 105 and the SiO$_2$ film 107 are eliminated by polishing. The planarizing by the CMP method should be carried out not to eliminate the whole SiO$_2$ film 105 formed on a convexity 103$a$ of the aluminum wiring layer.

Subsequently, as shown in FIG. 1H, an SiO$_2$ film 109 (cover insulating film) is formed on the planarized surface. This SiO$_2$ film 109 is formed by a plasma enhanced CVD method, and SiH$_4$ and N$_2$O are used as source gases. A film thickness of the SiO$_2$ film 109 is 100 nm.

The foregoing process of forming the SiO$_2$ films 105 (underlying insulating film), 107 and 109 (cover insulating film) results in formation, on the object 104 to be formed, an interlayer insulating film of a low dielectric constant, which has good heat resistivity and moisture absorption resistance. That is, since the SiO$_2$ film 107 has porosity, a relative dielectric constant thereof is smaller than that of a usual SiO$_2$ film. Also, since the usual SiO$_2$ film 109 is formed on the porous SiO$_2$ film 107, incursion of water into the SiO$_2$ film 107 can be prevented. Furthermore, performing the H plasma treatment for the SiO$_2$ film 107 can improve the moisture absorption resistance of the film. Moreover, the SiO$_2$ films 105, 107 and 109 have better heat resistivity compared with the organic insulating film since these films consist mainly of Si and O.

Fourth Embodiment

A fourth embodiment is a case of applying the third embodiment to a damascene process.

FIGS. 2A to 2M are cross-sectional views illustrating the fourth embodiment.

First, as shown in FIG. 2A, a BPSG (borophosphosilicate glass) film 202 is formed on a silicon substrate 201. Then, after an aluminum layer is formed thereon, patterning is performed for the same to form an aluminum wiring layer 203. It should be noted that the aluminum wiring layer 203 in figures is not patterned for convenience. The silicon substrate 201, the BPSG film 202 and the aluminum wiring layer 203 constitute an object 204 to be formed.

As shown in FIG. 2B, an SiO$_2$ film 205 (underlying insulating film) having a film thickness of 100 nm is formed on the aluminum wiring layer 203. This SiO$_2$ film 205 is formed by a plasma enhanced CVD method (plasma enhanced chemical vapor deposition method), and SiH$_4$ and N$_2$O are used as source gases.

Subsequently, as shown in FIG. 2C, an Si—C (—H) film 206 is formed on the $SiO_2$ film 205 (underlying insulating film). This Si—C (—H) film 206 is formed by using $SiH_4$ and $H_2O$ as source gases, applying an RF power having a frequency of 13.56 MHz and power of 300 W while keeping the silicon substrate 201 at 100° C., and performing plasma polymerization for $SiH_4$ and $H_2O$ at pressure of 1 Torr. At this time, flow rates of source gases are 30 sccm and 60 sccm for $SiH_4$ and $H_2O$ respectively. A film thickness of the Si—C (—H) film 206 is 500 nm.

It should be noted that in forming Si—C (—H) film 206 the metylsilane ($Si(CH_3)H_3$) can also be used instead of the $SiH_4$. When using the metylsilane ($Si(CH_3)H_3$) its flow rate is 30 sccm and the power of the RF power is 100 W, and the other process conditions are the same as in the case using the $SiH_4$.

Then, as shown in FIG. 2D, O (oxygen) plasma treatment is performed for the Si—C (—H) film 206. This O (oxygen) plasma treatment is performed supplying 600 sccm $O_2$ to a chamber (not shown) and applying RF power having frequency of 400 kHz and power of 300 W to the $O_2$. The time for the O (oxygen) plasma treatment is 360 sec, and the temperature of the silicon substrate 201 is maintained at 350° C. during undergoing the O (oxygen) plasma treatment.

In this O (oxygen) plasma treatment C or H contained in the Si—C (—H) film 206 is oxidized and discharged to the outside of the film. Voids are formed in portions, from which C or H has been discharged, and Si—O bond is formed on the portion. Accordingly, the Si—C (—H) film 206 becomes a porous $SiO_2$ film 207.

Subsequently, as shown in FIG. 2E, H (hydrogen) plasma treatment is performed for the porous $SiO_2$ film 207.

This H plasma treatment is performed by supplying $H_2$ of 600 sccm to a chamber (not shown) and applying RF power to upper and lower electrodes (not shown) that is opposing each other in the chamber. And the RF power applied to the upper electrode has frequency of 13.56 MHz and power of 50 W. On the other hand, the RF power applied to the lower electrode has frequency of 400 kHz and power of 400 W. Further, during undergoing the H plasma treatment, the pressure in the chamber is 0.1~0.2 Torr and the temperature of the silicon substrate 201 is maintained at 400° C. Still further, the time for the H plasma treatment is 60 sec.

The H plasma treatment substitutes Si—H bonds for dangling bonds of Si in an Si—O bond in the surface of the void. Therefore, OH radicals and water are made to be hard to bond to the dangling bonds of Si, which improves the moisture absorption resistance of the film.

Subsequently, as shown in FIG. 2F, patterning is performed for the porous $SiO_2$ film 207 to form a damascene trench 208. This damascene trench 208 reaches the $SiO_2$ film 205 formed below the $SiO_2$ film 207.

Then, as shown in FIG. 2G, an $SiO_2$ film 209 (first insulating film) is formed on the $SiO_2$ film 207 and on the side and bottom portions of the damascene trench 208. This $SiO_2$ film 209 is formed by a plasma enhanced CVD method, and $SiH_4$ and $N_2O$ are used as source gases. By the $SiO_2$ film 209 formed on the side portion of the damascene trench 208, Cu buried later in the damascene trench 208 can be prevented from being dispersed in the porous $SiO_2$ film 207.

Then, as shown in FIG. 2H, anisotropic etching is performed for the $SiO_2$ film 209 (first insulating film) and the $SiO_2$ film 205 (underlying insulating film) formed below the damascene trench 208. Accordingly, the $SiO_2$ film 209 is eliminated except for a portion formed on the side portion of the damascene trench 208. The $SiO_2$ film 205 formed below the damascene trench 208 is also eliminated. Thus, a contact hole that reaches the aluminum wiring layer 203 is formed below the damascene trench 208.

Subsequently, as shown in FIG. 2I, a Cu-plated film 210 is formed in the damascene trench 208 and on the $SiO_2$ film 207. The Cu-plated film 210 formed in the damascene trench 208 is used as a Cu wiring line.

Then, as shown in FIG. 2J, the Cu-plated film 210 formed on the $SiO_2$ film 207 is polished by a CMP method to be eliminated. Accordingly, the Cu-plated film remains only in the damascene trench 208.

Subsequently, as shown in FIG. 2K, a barrier metal TiN film 211 is formed above the damascene trench 208. Accordingly, Cu in the damascene trench 208 can be prevented from being dispersed in an $SiO_2$ film later formed above the same.

Then, as shown in FIG. 2L, patterning is performed to leave a TiN film 211a formed above the damascene trench 208, and the TiN film 211 formed on the other portions is etched to be eliminated.

Subsequently, as shown in FIG. 2M, an $SiO_2$ film 212 (cover insulating film) is formed on the $SiO_2$ film 207 and the TiN film 211a. This $SiO_2$ film 212 is formed by a plasma enhanced CVD method, and $SiH_4$ and $N_2O$ are used as source gases.

The foregoing process results in formation, on the object 204 to be formed, an interlayer insulating film of a low dielectric constant, which has good heat resistivity and moisture absorption resistance. That is, since the $SiO_2$ film 207 has porosity, a relative dielectric constant thereof is smaller than that of a usual $SiO_2$ film. Also, since the usual $SiO_2$ film 212 (cover insulating film) is formed on the porous $SiO_2$ film 207, incursion of water into the $SiO_2$ film 207 can be prevented. Furthermore, performing the H plasma treatment for the $SiO_2$ film 207 can improve the moisture absorption resistance of the film. Moreover, the $SiO_2$ films 207 and 212 have better heat resistivity compared with the organic insulating film film since these films consist mainly of Si and O.

Fifth Embodiment

A fifth embodiment is different from the first to fourth embodiments in that a carbon and oxygen containing, or carbon, oxygen and hydrogen containing (referred to as Si—C—O (—H), hereinafter) film is formed by performing plasma polymerization for TEOS and $O_2$.

FIGS. 1A to 1H are cross-sectional views illustrating the fifth embodiment.

First, as shown in FIG. 1A, a BPSG (borophosphosilicate glass) film 102 is formed on a silicon substrate 101. Then, after an aluminum film is formed on the BPSG film 102, patterning is performed for the same to form an aluminum wiring layer 103. The silicon substrate 101, the BPSG film 102 and the aluminum wiring layer 103 formed in this manner constitute an object 104 to be formed.

Then, as shown in FIG. 1B, an $SiO_2$ film 105 (underlying insulating film) is formed on the object 104 to be formed. This $SiO_2$ film 105 is formed by a plasma enhanced CVD method (plasma enhanced chemical vapor deposition method), and SiH4 and $N_2O$ are used as source gases. A film thickness of this $SiO_2$ film 105 is 100 nm. The $SiO_2$ film 105 can prevent $H_2O$ from being dispersed in the aluminum wiring layer 103, which may cause corrosion.

Subsequently, as shown in FIG. 1C, an Si—C—O (—H) film 106 is formed on the $SiO_2$ film 105 (underlying insulating film). This Si—C—O (—H) film 106 is formed by performing plasma polymerization for TEOS and $O_2$. This plasma polymerization is performed by applying an RF power having a frequency of 13.56 MHz and power of 100 W to the TEOS and $O_2$. Flow rates of the source gases at this time are 30 sccm for TEOS and 240 sccm for $O_2$, respectively. In forming the Si—C—O (—H) film 106 the temperature of the silicon substrate 101 is maintained at 400° C. and the pressure is held at 1 Torr. A film thickness of the Si—C—O (—H) 106 is 500 nm.

It should be noted that, in forming the Si—C—O (—H) 106, one of metylsilane ($Si(CH_3)H_3$) and trimethysililbotrate ($\{(CH_3)_3SiO\}_3B$) can also be used instead of the TEOS. When using one of these gases, the flow rate of the gas is 30 sccm and other process conditions are the same as in the case using the TEOS. Using the trimethysililbotrate, the Si—C—O (—H) film 106 further contains B (boron).

Then, as shown in FIG. 1D, O (oxygen) plasma treatment is performed for the Si—C—O (—H) film 106. This O (oxygen) plasma treatment is performed supplying 600 sccm $O_2$ to a chamber (not shown) and applying RF power having frequency of 400 kHz and power of 300 W to the $O_2$. The time for the O (oxygen) plasma treatment is 360 sec, and the temperature of the silicon substrate 101 is maintained at 350° C. during undergoing the O (oxygen) plasma treatment.

In this O (oxygen) plasma treatment C or H contained in the Si—C—O (—H) film 106 is oxidized and discharged to the outside of the film. Voids are formed in portions, from which C or H has been discharged, and Si—O bond is formed on the portion. Accordingly, the Si—C—O (—H) film 106 becomes a porous $SiO_2$ film 107.

Subsequently, as shown in FIG. 1E, H (hydrogen) plasma treatment is performed for the porous $SiO_2$ film 107.

This H plasma treatment is performed by supplying $H_2$ of 600 sccm to a chamber (not shown) and applying RF power to upper and lower electrodes (not shown) that is opposing each other in the chamber. And the RF power applied to the upper electrode has frequency of 13.56 MHz and power of 50 W. On the other hand, the RF power applied to the lower electrode has frequency of 400 kHz and power of 400 W. Further, during undergoing the H plasma treatment, the pressure in the chamber is 0.1~0.2 Torr and the temperature of the silicon substrate 101 is maintained at 400° C. Still further, the time for the H plasma treatment is 60 sec.

The H plasma treatment substitutes Si—H bonds for dangling bonds of Si in an Si—O bond in the surface of the void. Therefore, OH radicals and water are made to be hard to bond to the dangling bonds of Si, which improves the moisture absorption resistance of the film.

Subsequently, as shown in FIG. 1F, an $SiO_2$ film 108 is formed on the porous $SiO_2$ film 107. This $SiO_2$ film 108 is formed by a CVD method, which employs source gas containing TEOS and $O_3$. In this case, since $O_3$ contained in source gas has concentration enough for oxidation of TEOS, the $SiO_2$ film 108 exhibits flowability, and can be planarized to a considerable extent.

Then, as shown in FIG. 1G, the $SiO_2$ film 108 is polished by a CMP method (chemical mechanical polishing method) so as to planarize its surface. At this time, some portions of the previously formed $SiO_2$ films 105 and 107 are eliminated by polishing. The planarizing by the CMP method should be carried out not to eliminate the whole $SiO_2$ film 105 formed on a convexity 103a of the aluminum wiring layer.

Subsequently, as shown in FIG. 1H, an $SiO_2$ film 109 (cover insulating film) is formed on the smoothed surface. This $SiO_2$ film 109 is formed by a plasma enhanced CVD method, and $SiH_4$ and $N_2O$ are used as source gases. A film thickness of the $SiO_2$ film 109 is 100 nm.

The foregoing process of forming the $SiO_2$ films 105 (underlying insulating film), 107 and 109 (cover insulating film) results in formation, on the object 104 to be formed, an interlayer insulating film of a low dielectric constant, which has good heat resistivity and moisture absorption resistance. That is, since the $SiO_2$ film 107 has porosity, a relative dielectric constant thereof is smaller than that of a usual $SiO_2$ film. Also, since the usual $SiO_2$ film 109 is formed on the porous $SiO_2$ film 107, incursion of water into the $SiO_2$ film 107 can be prevented. Furthermore, performing the H plasma treatment for the $SiO_2$ film 107 can improve the moisture absorption resistance of the film. Moreover, the $SiO_2$ films 105, 107 and 109 have better heat resistivity compared with the organic insulating film since these films consist mainly of Si and O.

Sixth Embodiment

A sixth embodiment is a case of applying the fifth embodiment to a damascene process.

FIGS. 2A to 2M are cross-sectional views illustrating the sixth embodiment.

First, as shown in FIG. 2A, a BPSG (borophosphosilicate glass) film 202 is formed on a silicon substrate 201. Then, after an aluminum layer is formed thereon, patterning is performed for the same to form an aluminum wiring layer 203. It should be noted that the aluminum wiring layer 203 in figures is not patterned for convenience. The silicon substrate 201, the BPSG film 202 and the aluminum wiring layer 203 constituted an object 204 to be formed.

As shown in FIG. 2B, an $SiO_2$ film 205 (underlying insulating film) having a film thickness of 100 nm is formed on the aluminum wiring layer 203. This $SiO_2$ film 205 is formed by a plasma enhanced CVD method (plasma enhanced chemical vapor deposition method), and $SiH_4$ and $N_2O$ are used as source gases.

Subsequently, as shown in FIG. 2C, an Si—C—O (—H) film 206 is formed on the $SiO_2$ film 205 (underlying insulating film). This Si—C—O (—H) film 206 is formed by performing plasma polymerization for TEOS and $O_2$. This plasma polymerization is performed by applying an RF power having a frequency of 13.56 MHz and power of 100 W to the TEOS and $O_2$. Flow rates of source gases at this time are 30 sccm and 240 sccm for TEOS and $O_2$ respectively. In forming the Si—C—O (—H) film 106 the temperature of the silicon substrate 201 is maintained at 400° C. and the pressure is held at 1 Torr. A film thickness of the Si—C—O (—H) film 206 is 500 nm.

It should be noted that, in forming the Si—C—O (—H) 206, one of metylsilane ($Si(CH_3)H_3$) and trimethysililbotrate ($\{(CH_3)_3SiO\}_3B$) can also be used instead of the TEOS. When using one of these gases, the flow rate of the gas is 30 sccm and other process conditions are the same as in the case using the TEOS. Using the trimethysililbotrate, the Si—C—O (—H) film 206 further contains B (boron).

Then, as shown in FIG. 2D, O (oxygen) plasma treatment is performed for the Si—C—O (—H) film 206. This O (oxygen) plasma treatment is performed supplying 600 sccm $O_2$ to a chamber (not shown) and applying RF power having frequency of 400 kHz and power of 300 W to the $O_2$. The time for the O (oxygen) plasma treatment is 360 sec, and the temperature of the silicon substrate 201 is maintained at 350° C. during undergoing the O (oxygen) plasma treatment.

In this O (oxygen) plasma treatment C or H contained in the Si—C—O (—H) film 206 is oxidized and discharged to the outside of the film. Voids are formed in portions, from which C or H has been discharged, and Si—O bond is formed on the portion. Accordingly, the Si—C—O (—H) film 206 becomes a porous $SiO_2$ film 207.

Subsequently, as shown in FIG. 2E, H (hydrogen) plasma treatment is performed for the porous $SiO_2$ film 207.

This H plasma treatment is performed by supplying $H_2$ of 600 sccm to a chamber (not shown) and applying RF power to upper and lower electrodes (not shown) that is opposing each other in the chamber. And the RF power applied to the upper electrode has frequency of 13.56 MHz and power of 50 W. On the other hand, the RF power applied to the lower electrode has frequency of 400 kHz and power of 400 W. Further, during undergoing the H plasma treatment, the pressure in the chamber is 0.1~0.2 Torr and the temperature of the silicon substrate 201 is maintained at 400° C. Still further, the time for the H plasma treatment is 60 sec.

The H plasma treatment substitutes Si—H bonds for dangling bonds of Si in an Si—O bond in the surface of the void. Therefore, OH radicals and water are made to be hard to bond to the dangling bonds of Si, which improves the moisture absorption resistance of the film.

Subsequently, as shown in FIG. 2F, patterning is performed for the $SiO_2$ film 207 to damascene trench 208. This damascene trench 208 reaches the $SiO_2$ film 205 formed below the $SiO_2$ film 207.

Then, as shown in FIG. 2G, an $SiO_2$ film 209 (first insulating film) is formed on the $SiO_2$ film 207 and on the side and bottom portions of the damascene trench 208. This $SiO_2$ film 209 is formed by a plasma enhanced CVD method, and $SiH_4$ and $N_2O$ are used as source gases. By the $SiO_2$ film 209 formed on the side portion of the damascene trench 208, Cu buried later in the damascene trench 208 can be prevented from being dispersed in the porous $SiO_2$ film 207.

Then, as shown in FIG. 2H, anisotropic etching is performed for the $SiO_2$ film 209 (first insulating film) and the $SiO_2$ film 205 (underlying insulating film) formed below the damascene trench 208. Accordingly, the $SiO_2$ film 209 is eliminated except for a portion formed on the side portion of the damascene trench 208. Also, since the $SiO_2$ film 205 formed below the damascene trench 208 is eliminated, a contact hole that reaches the aluminum wiring layer 203 is formed below the damascene trench 208.

Subsequently, as shown in FIG. 2I, a Cu-plated film 210 is formed in the damascene trench 208 and on the $SiO_2$ film 207. The Cu-plated film 210 formed in the damascene trench 208 is used as a Cu wiring line.

Then, as shown in FIG. 2J, the Cu-plated film 210 formed on the $SiO_2$ film 207 is polished by a CPM method to be eliminated. Accordingly, the Cu-plated film remains only in the damascene trench 208.

Subsequently, as shown in FIG. 2K, a barrier metal TiN film 211 is formed above the damascene trench 208. Accordingly, Cu in the damascene trench 208 can be prevented from being dispersed in an $SiO_2$ film later formed above the damascene trench 208.

Then, as shown in FIG. 2L, patterning is performed to leave a TiN film 211a formed above the damascene trench 208, and the TiN film 211 formed in the other portions is etched to be eliminated.

Subsequently, as shown in FIG. 2M, an $SiO_2$ film 212 (cover insulating film) is formed on the $SiO_2$ film 207 and the TiN film 211a. This $SiO_2$ film 212 is formed by a plasma enhanced CVD method, and $SiH_4$ and $N_2O$ are used as source gases.

The foregoing process results in formation, on the object 204 to be formed, an interlayer insulating film of a low dielectric constant, which has good heat resistivity and moisture absorption resistance. That is, since the $SiO_2$ film 207 has porosity, a relative dielectric constant thereof is smaller than that of a usual $SiO_2$ film. Also, since the usual $SiO_2$ film 212 (cover insulating film) is formed on the porous $SiO_2$ film 207, incursion of water into the $SiO_2$ film 207 can be prevented. Furthermore, performing the H plasma treatment for the $SiO_2$ film 207 can improve the moisture absorption resistance of the film. Moreover, the $SiO_2$ films 207 and 212 have better heat resistivity compared with the organic insulating film since these films consist mainly of Si and O.

Seventh Embodiment

A seventh embodiment is different from the first to sixth embodiments in that, instead of forming a porous $SiO_2$ film, a porous B-containing $SiO_2$ film is formed.

FIGS. 1A to 1H are cross-sectional views illustrating the seventh embodiment.

First, as shown in FIG. 1A, a BPSG (borophosphosilicate glass) film 102 is formed on a silicon substrate 101. Then, after an aluminum film is formed on the BPSG film 102, patterning is performed for the same to form an aluminum wiring layer 103. The silicon substrate 101, the BPSG film 102 and the aluminum wiring layer 103 formed in this manner constitute an object 104 to be formed.

Then, as shown in FIG. 1B, an $SiO_2$ film 105 (underlying insulating film) is formed on the object 104 to be formed. This $SiO_2$ film 105 is formed by a plasma enhanced CVD method (plasma enhanced chemical vapor deposition method), and $SiH_4$ and $N_2O$ are used as source gases. A film thickness of the $SiO_2$ film 105 is 100 nm. The $SiO_2$ film 105 can prevent $H_2O$ from being dispersed in the aluminum wiring layer 103, which may cause corrosion.

Subsequently, as shown in FIG. 1C, a carbon and boron, or carbon, boron and hydrogen containing (referred to as Si—C—B (—H), hereinafter) film 106 is formed on the $SiO_2$ film 105 (underlying insulating film). This Si—C—B (—H) film 106 is formed by using TEOS and $B_2H_6$ as source gases, applying an RF power having a frequency of 13.56 MHz and a power of 100 W while keeping the silicon substrate 101 at 100° C., and performing plasma polymerization for TEOS and $B_2H_6$ at pressure of 1 Torr. Flow rates of source gases at this time are 30 sccm and 24 sccm for TEOS and $B_2H_6$ respectively. A film thickness of this Si—C—B (—H) film 106 is 500 nm.

It should be noted that, in forming the Si—C—B (—H) film 106, one of metylsilane ($Si(CH_3)H_3$) and trimethysilibotrate ($\{(CH_3)_3SiO\}_3B$) can also be used instead of the TEOS. When using one of these gases, the flow rate of the gas is 30 sccm and the other process conditions are the same as in the case using the TEOS.

Furthermore, one of TMB ($B(OCH_3)_3$) and TEB ($B(OC_2H_5)_3$) can also be used instead of the $B_2H_6$. When using one of these gases, the flow rate of the gas is 48 sccm and the other process condition is the same as in the above.

Then, as shown in FIG. 1D, O (oxygen) plasma treatment is performed for the Si—C—B (—H) film 106. This O (oxygen) plasma treatment is performed supplying 600 sccm $O_2$ to a chamber (not shown) and applying RF power having frequency of 400 kHz and power of 300 W to the $O_2$. The time for the O (oxygen) plasma treatment is 360 sec, and the temperature of the silicon substrate 101 is maintained at 350° C. during undergoing the O (oxygen) plasma treatment.

In this O (oxygen) plasma treatment C or H contained in the Si—C—B (—H) film 106 is oxidized and discharged to the outside of the film. Voids are formed in portions, from which C or H has been discharged, and Si—O bond is formed on the portion. Accordingly, the Si—C—B (—H) film 106 becomes a porous B-containing $SiO_2$ film 107.

Subsequently, as shown in FIG. 1E, H (hydrogen) plasma treatment is performed for the porous B-containing $SiO_2$ film 107.

This H plasma treatment is performed by supplying $H_2$ of 600 sccm to a chamber (not shown) and applying RF power to upper and lower electrodes (not shown) that is opposing each other in the chamber. And the RF power applied to the upper electrode has frequency of 13.56 MHz and power of 50 W. On the other hand, the RF power applied to the lower electrode has frequency of 400 kHz and power of 400 W. Further, during undergoing the H plasma treatment, the pressure in the chamber is 0.1~0.2 Torr and the temperature of the silicon substrate 101 is maintained at 400° C. Still further, the time for the H plasma treatment is 60 sec.

The H plasma treatment substitutes Si—H bonds for dangling bonds of Si in an Si—O bond in the surface of the void. Therefore, OH radicals and water are made to be hard to bond to the dangling bonds of Si, which improves the moisture absorption resistance of the film.

Subsequently, as shown in FIG. 1F, an $SiO_2$ film 108 is formed on the porous B-containing $SiO_2$ film 107. This $SiO_2$ film 108 is formed by a CVD method, which contains TEOS and $O_3$ as source gases. In this case, since $O_3$ in source gas has concentration enough for oxidation of TEOS, the $SiO_2$ film 108 exhibits flowability, and can be planarized to a considerable extent.

Then, as shown in FIG. 1G, the $SiO_2$ film 108 is polished by a CMP method (chemical mechanical polishing method) to planarize its surface. At this time, some portions of the $SiO_2$ film 105 and the B-containing $SiO_2$ film 107 which have been formed before are eliminated by polishing. The planarizing by the CMP method should be carried out not to eliminate the whole $SiO_2$ film 105 formed on a convexity 103a of the aluminum wiring layer.

Subsequently, as shown in FIG. 1H, an $SiO_2$ film 109 (cover insulating film) is formed on the planarized surface. This $SiO_2$ film 109 is formed by a plasma enhanced CVD method, and $SiH_4$ and $N_2O$ are used as source gases. A film thickness of the $SiO_2$ film 109 is 100 nm.

The foregoing process of forming the $SiO_2$ films 105 (underlying insulating film), 109 (cover insulating film) and the B-containing $SiO_2$ film 107 results in formation, on the object 104 to be formed, an interlayer insulating film of a low dielectric constant, which has good heat resistivity and moisture absorption resistance. That is, since the B-containing $SiO_2$ film 107 has porosity, a relative dielectric constant thereof is smaller than that of a usual $SiO_2$ film. Also, since the usual $SiO_2$ film 109 is formed on the porous B-containing $SiO_2$ film 107, incursion of water into the B-containing $SiO_2$ film 107 can be prevented. Furthermore, performing the H plasma treatment for the $SiO_2$ film 107 can improve the moisture absorption resistance of the film. Moreover, the $SiO_2$ films 105 and 109 and the B-containing $SiO_2$ film 107 have better heat resistivity compared with the organic insulating film since these films consist mainly of Si and O.

Eighth Embodiment

An eight embodiment is a case of applying the seventh embodiment to a damascene process.

FIGS. 2A to 2M are cross-sectional views illustrating the eighth embodiment.

First, as shown in FIG. 2A, a BPSG (borophosphosilicate glass) film 202 is formed on a silicon substrate 201. Then, after an aluminum layer is formed thereon, patterning is performed for the same to form an aluminum wiring layer 203. It should be noted that the aluminum wiring layer 203 in figures is not patterned for convenience. The silicon substrate 201, the BPSG film 202 and the aluminum wiring layer 203 constitute an object 204 to be formed.

As shown in FIG. 2B, an $SiO_2$ film 205 (underlying insulating film) having a film thickness of 100 nm is formed on the aluminum wiring layer 203. This $SiO_2$ film 205 is formed by a plasma enhanced CVD method (plasma enhanced chemical vapor deposition method), and $SiH_4$ and $N_2O$ are used as source gases.

Subsequently, as shown in FIG. 2C, an Si—C—B (—H) film 206 is formed on the $SiO_2$ film 205 (underlying insulating film). This Si—C—B (—H) film 206 is formed by using TEOS (Tetra-Ethyl-Ortho-Silicate) and $B_2H_6$ as source gases, applying an RF power having a frequency of 13.56 MHz and a power of 100 W while keeping the silicon substrate 201 at 100° C., and performing plasma polymerization for TEOS and $B_2H_6$ at pressure of 1 Torr. At this time, flow rates of source gases are 30 sccm and 24 sccm for TEOS and $B_2H_6$ respectively. A film thickness of the Si—C—B (—H) film 206 is 500 nm.

It should be noted that, in forming the Si—C—B (—H) film 206, one of metylsilane ($Si(CH_3)H_3$) and trimethysilibotrate ($\{(CH_3)_3SiO\}_3B$) can also be used instead of the TEOS. When using one of these gases, the flow rate of the gas is 30 sccm and the other process conditions are the same as in the case using the TEOS.

Furthermore, one of TMB ($B(OCH_3)_3$) and TEB ($B(OC_2H_5)_3$) can also be used instead of the $B_2H_6$. When using one of these gases, the flow rate of the gas is 48 sccm and the other process condition is the same as in the above.

Then, as shown in FIG. 2D, O (oxygen) plasma treatment is performed for the Si—C—B (—H) film 206. This O (oxygen) plasma treatment is performed supplying 600 sccm $O_2$ to a chamber (not shown) and applying RF power having frequency of 400 kHz and power of 300 W to the $O_2$. The time for the O (oxygen) plasma treatment is 360 sec, and the temperature of the silicon substrate 201 is maintained at 350° C. during undergoing the O (oxygen) plasma treatment.

In this O (oxygen) plasma treatment C or H contained in the Si—C—B (—H) film 206 is oxidized and discharged to the outside of the film. Voids are formed in portions, from which C or H has been discharged, and Si—O bond is formed. Accordingly, the Si—C—B (—H) film 206 becomes a porous B-containing $SiO_2$ film 207.

Subsequently, as shown in FIG. 2E, H (hydrogen) plasma treatment is performed for the porous B-containing $SiO_2$ film 207.

This H plasma treatment is performed by supplying $H_2$ of 600 sccm to a chamber (not shown) and applying RF power to upper and lower electrodes (not shown) that is opposing each other in the chamber. And the RF power applied to the upper electrode has frequency of 13.56 MHz and power of 50 W. On the other hand, the RF power applied to the lower electrode has frequency of 400 kHz and power of 400 W. Further, during undergoing the H plasma treatment, the pressure in the chamber is 0.1~0.2 Torr and the temperature of the silicon substrate 201 is maintained at 400° C. Still further, the time for the H plasma treatment is 60 sec.

The H plasma treatment substitutes Si—H bonds for dangling bonds of Si in an Si—O bond in the surface of the void. Therefore, OH radicals and water are made to be hard to bond to the dangling bonds of Si, which improves the moisture absorption resistance of the film.

Subsequently, as shown in FIG. 2F, patterning is performed for the B-containing $SiO_2$ film 207 to form a damascene trench 208. This damascene trench 208 reaches the $SiO_2$ film 205 formed below the B-containing $SiO_2$ film 207.

Then, as shown in FIG. 2G, an $SiO_2$ film 209 (first insulating film) is formed on the B-containing $SiO_2$ film 207 and on the side and bottom portions of the damascene trench 208. This $SiO_2$ film 209 is formed by a plasma enhanced CVD method, and $SiH_4$ and $N_2O$ are used as source gases. By the $SiO_2$ film 209 formed on the side portion of the damascene trench 208, Cu later buried in the damascene trench 208 can be prevented from being dispersed in the porous B-containing $SiO_2$ film 207.

Then, as shown in FIG. 2H, anisotropic etching is performed for the $SiO_2$ film 209 (first insulating film) and the $SiO_2$ film 205 (underlying insulating film) formed below the damascene trench 208. Accordingly, the $SiO_2$ film 209 is eliminated except for a portion formed on the side portion of the damascene trench 208. Also, since the $SiO_2$ film 205 formed below the damascene trench 208 is eliminated, a contact hole that reaches the aluminum wiring layer 203 is formed below the damascene trench 208.

Subsequently, as shown in FIG. 2I, a Cu-plated film 210 is formed in the damascene trench 208 and on the B-containing $SiO_2$ film 207. The Cu-plated film 210 formed in the damascene trench 208 is used as a Cu wiring line.

Then, as shown in FIG. 2J, the Cu-plated film 210 formed on the B-containing $SiO_2$ film 207 is polished by a CMP method to be eliminated. Accordingly, the Cu-plated film 210 remains only in the damascene trench 208.

Subsequently, as shown in FIG. 2K, a barrier metal TiN film 211 is formed above the damascene trench 208. Accordingly, Cu in the damascene trench 208 can be prevented from being dispersed in an $SiO_2$ film formed later above the damascene trench 208.

Then, as shown in FIG. 2L, patterning is performed to leave a TiN film 211a formed above the damascene trench 208, and the TiN film 211 formed on the other portions are etched to be eliminated.

Subsequently, as shown in FIG. 2M, an $SiO_2$ film 212 (cover insulating film) is formed on the B-containing $SiO_2$ film 207 and the TiN film 211a. This $SiO_2$ film 212 is formed by a plasma enhanced CVD method, and $SiH_4$ and $N_2O$ are used as source gases.

The foregoing process results in formation, on the object 204 to be formed, an interlayer insulating film of a low dielectric constant, which has good heat resistivity and moisture absorption resistance. That is, since the B-containing $SiO_2$ film 207 has porosity, a relative dielectric constant thereof is smaller than that of a usual $SiO_2$ film. Also, since the usual $SiO_2$ film 212 (cover insulating film) is formed on the porous B-containing $SiO_2$ film 207, incursion of water into the B-containing $SiO_2$ film 207 can be prevented. Furthermore, performing the H plasma treatment for the $SiO_2$ film 207 can improve the moisture absorption resistance of the film. Moreover, the B-containing $SiO_2$ film 207 and the $SiO_2$ film 212 have better heat resistivity compared with the organic insulating film since these films consist mainly of Si and O.

Ninth Embodiment

In a ninth embodiment, a film containing carbon, boron and oxygen, or a film containing carbon, boron, oxygen and hydrogen (referred to as Si—C—B—O (—H) film, hereinafter) is formed in order to form a porous B-containing $SiO_2$ film.

FIGS. 1A to 1H are cross-sectional views illustrating the ninth embodiment.

First, as shown in FIG. 1A, a BPSG (borophosphosilicate glass) film 102 is formed on a silicon substrate 101. Then, after an aluminum film is formed on the BPSG film 102, patterning is performed for the same to form an aluminum wiring layer 103. The silicon substrate 101, the BPSG film 102 and the aluminum wiring layer 103 formed in this manner constitute an object 104 to be formed.

Then, as shown in FIG. 1B, an $SiO_2$ film 105 (underlying insulating film) is formed on the object 104 to be formed. This $SiO_2$ film 105 is formed by a plasma enhanced CVD method (plasma enhanced chemical vapor deposition method), and $SiH_4$ and $N_2O$ are used as source gases. A film thickness of the $SiO_2$ film 105 is 100 nm. The $SiO_2$ film 105 can prevent $H_2O$ from being dispersed in the aluminum wiring layer 103, which may cause corrosion.

Subsequently, as shown in FIG. 1C, an Si—C—B—O (—H) film 106 is formed on the $SiO_2$ film 105 (underlying insulating film). This Si—C—B—O (—H) film 106 is formed by performing plasma polymerization for TEOS, $B_2H_6$, and $O_2$. This plasma polymerization is performed by applying an RF power having frequency of 13.56 MHz and power of 100 W to the TEOS, $B_2H_6$, and $O_2$. And the flow rates of source gases at this time are 30 sccm, 24 sccm and 260 sccm for TEOS, $B_2H_6$ and $O_2$ respectively. In forming the Si—C—B—O (—H) film 106 the temperature of the silicon substrate 101 is maintained at 400° C. and the pressure is held at 1 Torr. A film thickness of the Si—C—B—O (—H) film 106 is 500 nm.

It should be noted that, in forming the Si—C—B—O (—H) film 106, one of metylsilane ($Si(CH_3)H_3$) and trimethysililbotrate ($\{(CH_3)_3SiO\}_3B$) can also be used instead of the TEOS. When using one of these gases, the flow rate of the gas is 30 sccm and the other process conditions are the same as in the case using the TEOS.

Furthermore, one of TMB ($B(OCH_3)_3$) and TEB ($B(OC_2H_5)_3$) can also be used instead of the $B_2H_6$. When using one of these gases, the flow rate of the gas is 48 sccm and the other process conditions are the same as in the above.

Then, as shown in FIG. 1D, O (oxygen) plasma treatment is performed for the Si—C—B—O (—H) film 106. This O (oxygen) plasma treatment is performed supplying 600 sccm $O_2$ to a chamber (not shown) and applying RF power having frequency of 400 kHz and power of 300 W to the $O_2$. The time for the O (oxygen) plasma treatment is 360 sec, and the temperature of the silicon substrate 101 is maintained at 350° C. during undergoing the O (oxygen) plasma treatment.

In this O (oxygen) plasma treatment C or H contained in the Si—C—B—O (—H) film 106 is oxidized, and discharged to the outside of the film. Voids are formed in portions, from which C or H has been discharged, and Si—O bond is formed on the portion. Accordingly, the Si—C—B—O (—H) film 106 becomes a porous B-containing $SiO_2$ film 107.

Subsequently, as shown in FIG. 1E, H (hydrogen) plasma treatment is performed for the porous B-containing $SiO_2$ film 107.

This H plasma treatment is performed by supplying $H_2$ of 600 sccm to a chamber (not shown) and applying RF power to upper and lower electrodes (not shown) that is opposing each other in the chamber. And the RF power applied to the upper electrode has frequency of 13.56 MHz and power of 50 W. On the other hand, the RF power applied to the lower electrode has frequency of 400 kHz and power of 400 W. Further, during undergoing the H plasma treatment, the pressure in the chamber is 0.1~0.2 Torr and the temperature of the silicon substrate 101 is maintained at 400° C. Still further, the time for the H plasma treatment is 60 sec.

The H plasma treatment substitutes Si—H bonds for dangling bonds of Si in an Si—O bond in the surface of the void. Therefore, OH radicals and water are made to be hard to bond to the dangling bonds of Si, which improves the moisture absorption resistance of the film.

Subsequently, as shown in FIG. 1F, an $SiO_2$ film 108 is formed on the porous B-containing $SiO_2$ film 107. This $SiO_2$ film 108 is formed by a CVD method, which contains TEOS and $O_3$ as source gases. In this case, since $O_3$ in source gas has concentration enough for oxidation of TEOS, the $SiO_2$ film 108 exhibits flowability, and can be planarized to a considerable extent.

Then, as shown in FIG. 1G, the $SiO_2$ film 108 is polished by a CMP method (chemical mechanical polishing method) to planarize its surface. At this time, some portions of the $SiO_2$ film 105 and the B-containing $SiO_2$ film 107 which have been formed before are eliminated by polishing. The planarizing by the CMP method should be carried out not to eliminate the whole $SiO_2$ film 105 formed on a convexity 103a of the aluminum wiring layer.

Subsequently, as shown in FIG. 1H, an $SiO_2$ film 109 (cover insulating film) is formed on the planarized surface. This $SiO_2$ film 109 is formed by a plasma enhanced CVD method, and $SiH_4$ and $N_2O$ are used as source gases. A film thickness of the $SiO_2$ film 109 is 100 nm.

The foregoing process of forming the $SiO_2$ films 105 (underlying insulating film) and 109 (cover insulating film), and the B-containing $SiO_2$ film 107 results in formation, on the object 104 to be formed, an interlayer insulating film of a low dielectric constant, which has good heat resistivity and moisture absorption resistance. That is, since the B-containing $SiO_2$ film 107 has porosity, a relative dielectric constant thereof is smaller than that of a usual $SiO_2$ film. Also, since the usual $SiO_2$ film 109 is formed on the porous B-containing $SiO_2$ film 107, incursion of water into the B-containing $SiO_2$ film 107 can be prevented. Furthermore, performing the H plasma treatment for the $SiO_2$ film 107 can improve the moisture absorption resistance of the film. Moreover, the $SiO_2$ films 105 and 109 and the B-containing $SiO_2$ film 107 have better heat resistivity compared with the organic insulating film since these films consist mainly of Si and O.

Tenth Embodiment

A tenth embodiment is a case of applying the ninth embodiment to a damascene process.

FIGS. 2A to 2M are cross-sectional views illustrating the tenth embodiment.

First, as shown in FIG. 2A, a BPSG (borophosphosilicate glass) film 202 is formed on a silicon substrate 201. After an aluminum layer is formed thereon, patterning is performed for the same to form an aluminum wiring layer 203. It should ne noted that the aluminum wiring layer 203 in figures is not patterned for convenience. The silicon substrate 201, the BPSG film 202 and the aluminum wiring layer 203 constitute an object 204 to be formed.

Then, as shown in FIG. 2B, an $SiO_2$ film 205 (underlying insulating film) having a film thickness of 100 nm is formed on the aluminum wiring layer 203. This $SiO_2$ film 205 is formed by a plasma enhanced CVD method (plasma enhanced chemical vapor deposition method), and $SiH_4$ and $N_2O$ are used as source gases.

Subsequently, as shown in FIG. 2C, an Si—C—B—O (—H) film 206 is formed on the $SiO_2$ film 205 (underlying insulating film). This Si—C—B—O (—H) film 206 is formed by using TEOS (Tetra-Ethyl-Ortho-Silicate), $B_2H_6$ and $O_2$ as source gases, and performing plasma polymerization for these source gases. This plasma polymerization is performed by applying an RF power having frequency of 13.56 MHz and power of 100 W to the TEOS, $B_2H_6$, and $O_2$. And the flow rates of source gases at this time are 30 sccm, 24 sccm and 260 sccm for TEOS, $B_2H_6$ and $O_2$ respectively. In forming the Si—C—B—O (—H) film 206 the temperature of the silicon substrate 201 is maintained at 400° C. and the pressure is held at 1 Torr. A film thickness of the Si—C—B—O (—H) film 206 is 500 nm.

It should be noted that, in forming the Si—C—B—O (—H) film 206, one of metylsilane ($Si(CH_3)H_3$) and trimethysililbotrate ($\{(CH_3)_3SiO\}_3B$) can also be used instead of the TEOS. When using one of these gases, the flow rate of the gas is 30 sccm and the other process conditions are the same as in the case using the TEOS.

Furthermore, one of TMB ($B(OCH_3)_3$) and TEB ($B(OC_2H_5)_3$) can also be used instead of the $B_2H_6$. When using one of these gases, the flow rate of the gas is 48 sccm and the other process conditions are the same as in the above.

Then, as shown in FIG. 2D, O (oxygen) plasma treatment is performed for the Si—C—B—O (—H) film 206. This O (oxygen) plasma treatment is performed supplying 600 sccm $O_2$ to a chamber (not shown) and applying RF power having frequency of 400 kHz and power of 300 W to the $O_2$. The time for the O (oxygen) plasma treatment is 360 sec, and the temperature of the silicon substrate 201 is maintained at 350° C. during undergoing the O (oxygen) plasma treatment.

In this O (oxygen) plasma treatment C or H contained in the Si—C—B—O (—H) film 206 is oxidized, and discharged to the outside. Voids are formed in portions, from which C or H has been discharged, and Si—O bond is formed on the portion. Accordingly, the Si—C—B—O (—H) film 206 becomes a porous B-containing $SiO_2$ film 207.

Subsequently, as shown in FIG. 2E, H (hydrogen) plasma treatment is performed for the porous B-containing $SiO_2$ film 207.

This H plasma treatment is performed by supplying $H_2$ of 600 sccm to a chamber (not shown) and applying RF power to upper and lower electrodes (not shown) that is opposing each other in the chamber. And the RF power applied to the upper electrode has frequency of 13.56 MHz and power of 50 W. On the other hand, the RF power applied to the lower electrode has frequency of 400 kHz and power of 400 W. Further, during undergoing the H plasma treatment, the pressure in the chamber is 0.1~0.2 Torr and the temperature of the silicon substrate 201 is maintained at 400° C. Still further, the time for the H plasma treatment is 60 sec.

The H plasma treatment substitutes Si—H bonds for dangling bonds of Si in an Si—O bond in the surface of the void. Therefore, OH radicals and water are made to be hard to bond to the dangling bonds of Si, which improves the moisture absorption resistance of the film.

Subsequently, as shown in FIG. 2F, patterning is performed for the B-containing $SiO_2$ film 207 to form a damascene trench 208. This damascene trench 208 reaches the $SiO_2$ film 205 formed below the B-containing $SiO_2$ film 207.

Then, as shown in FIG. 2G, an SiO$_2$ film 209 (first insulating film) is formed on the B-containing SiO$_2$ film 207 and on the side and bottom portions of the damascene trench 208. This SiO$_2$ film 209 is formed by a plasma enhanced CVD method, and SiH$_4$ and N$_2$O are used as source gases. By the SiO$_2$ film 209 formed on the side portion of the damascene trench 208, Cu buried later in the damascene trench 208 can be prevented from being dispersed in the porous B-containing SiO$_2$ film 207.

Then, as shown in FIG. 2H, anisotropic etching is performed for the SiO$_2$ film 209 (first insulating film) and the SiO$_2$ film 205 (underlying insulating film) formed below the damascene trench 208. Accordingly, the SiO$_2$ film 209 is eliminated except for a portion formed on the side portion of the damascene trench 208. Also, since the SiO$_2$ film 205 formed below the damascene trench 208 is eliminated, a contact hole that reaches the aluminum wiring layer 203 is formed below the damascene trench 208.

Subsequently, as shown in FIG. 2I, a Cu-plated film 210 is formed in the damascene trench 208 and on the B-containing SiO$_2$ film 207. The Cu-plated film 210 formed in the damascene trench 208 is used as a Cu wiring line.

Then, as shown in FIG. 2J, The Cu-plated film 210 formed on the B-containing SiO$_2$ film 207 is polished by a CMP method to be eliminated. Accordingly, the Cu-plated film remains only in the damascene trench 208.

Subsequently, as shown in FIG. 2K, a barrier metal TiN film 211 is formed above the damascene trench 208. Accordingly, Cu in the damascene trench 208 can be prevented from being dispersed in an SiO$_2$ film formed later above the damascene trench 208.

Then, as shown in FIG. 2L, patterning is performed to leave a TiN film 211a formed above the damascene trench 208, and the TiN film 211 formed on the other portions are etched to be eliminated.

Subsequently, as shown in FIG. 2M, an SiO$_2$ film 212 (cover insulating film) is formed on the B-containing SiO$_2$ film 207 and the TIN film 211a. This SiO$_2$ film 212 is formed by a plasma enhanced CVD method, and SiH$_4$ and N$_2$O are used as source gases.

The foregoing process results in formation, on the object 204 to be formed, an interlayer insulating film of a low dielectric constant, which has good heat resistivity and moisture absorption resistance. That is, since the B-containing SiO$_2$ film 207 has porosity, a relative dielectric constant thereof is smaller than that of a usual SiO$_2$ film. Also, since the usual SiO$_2$ film 212 (cover insulating film) is formed on the porous B-containing SiO$_2$ film 207, incursion of water into the B-containing SiO$_2$ film 207 can be prevented. Furthermore, performing the H plasma treatment for the SiO$_2$ film 207 can improve the moisture absorption resistance of the film. Moreover, the B-containing SiO$_2$ film 207 and the SiO$_2$ film 212 have better heat resistivity compared with the organic insulating film since these films consist mainly of Si and O.

Eleventh Embodiment

An eleventh embodiment is different from the first to tenth embodiments in that porous F-containing SiO$_2$ film is formed instead of forming a porous SiO$_2$ film or a porous B-containing SiO$_2$ film.

FIGS. 1A to 1H are cross-sectional views illustrating the eleventh embodiment.

First, as shown in FIG. 1A, a BPSG (borophosphosilicate glass) film 102 is for on a silicon substrate 101. Then, after an aluminum film is formed on the BPSG film 102, patterning is performed for the same to form an aluminum wiring layer 103. The silicon substrate 101, the BPSG film 102 and the aluminum wiring layer 103 constitute an object 104 to be formed.

Then, as shown in FIG. 1B, an SiO$_2$ film 105 (underlying insulating film) is formed on the object 104 to be formed. This SiO$_2$ film 105 is formed by a plasma enhanced CVD method (plasma enhanced chemical vapor deposition method), and SiH$_4$ and N$_2$O are used as source gases. A film thickness of the SiO$_2$ film 105 is 100 mn. The SiO$_2$ film 105 can prevent H$_2$O from being dispersed in the aluminum wiring layer 103, which may cause corrosion.

Subsequently, as shown in FIG. 1C, a film 106 containing carbon and fluorine or carbon, fluorine and hydrogen (referred to as Si—C—F (—H) film, hereinafter) is formed on the SiO$_2$ film 105 (underlying insulating film). This Si—C—F (—H) film 106 is formed by using TEOS and C$_2$F$_6$ as source gases, applying an RF power having a frequency of 13.56 MHz and a power of 100 W while keeping the silicon substrate 101 at 100° C., and performing plasma polymerization for TEOS and C$_2$F$_6$ at pressure of 1 Torr. Flow rates of source gases at this time are 30 sccm and 5 sccm for TEOS and C$_2$F$_6$ respectively. A film thickness of the Si—C—F (—H) film 106 is 500 nm.

It should be noted that in forming the Si—C—F (—H) film 106, metylsilane (Si(CH$_3$)H$_3$) can also be used instead of the TEOS. When using the metylsilane, its flow rate is 30 sccm and the other process conditions are the same as in the case using the TEOS.

Then, as shown in FIG. 1D, O (oxygen) plasma treatment is performed for the Si—C—F (—H) film 106. This O (oxygen) plasma treatment is performed supplying 600 sccm O$_2$ to a chamber (not shown) and applying RF power having frequency of 400 kHz and power of 300 W to the O$_2$. The time for the O (oxygen) plasma treatment is 360 sec, and the temperature of the silicon substrate 101 is maintained at 350° C. during undergoing the O (oxygen) plasma treatment.

In this O (oxygen) plasma treatment C or H contained in the Si—C—F (—H) film 106 is oxidized, and discharged to the outside of the film. Voids are formed in portions, from which C or H has been discharged, and Si—O bond is formed on the portion. Accordingly, the Si—C—F (—H) film 106 becomes a porous F-containing SiO$_2$ film 107.

Subsequently, as shown in FIG. 1E, H (hydrogen) plasma treatment is performed for the porous F-containing SiO$_2$ film 107.

This H plasma treatment is performed by supplying H$_2$ of 600 sccm to a chamber (not shown) and applying RF power to upper and lower electrodes (not shown) that is opposing each other in the chamber. And the RF power applied to the upper electrode has frequency of 13.56 MHz and power of 50 W. On the other hand, the RF power applied to the lower electrode has frequency of 400 kHz and power of 400 W. Further, during undergoing the H plasma treatment, the pressure in the chamber is 0.1~0.2 Torr and the temperature of the silicon substrate 101 is maintained at 400° C. Still further, the time for the H plasma treatment is 60 sec.

The H plasma treatment substitutes Si—H bonds for dangling bonds of Si in an Si—O bond in the surface of the void. Therefore, OH radicals and water are made to be hard to bond to the dangling bonds of Si, which improves the moisture absorption resistance of the film.

Subsequently, as shown in FIG. 1F, an SiO$_2$ film 108 is formed on the porous F-containing SiO$_2$ film 107. This SiO$_2$ film 108 is formed by a CVD method, which contains TEOS and O$_3$ as source gases. In this case, since O$_3$ in source gas had concentration enough for oxidation of TEOS, the SiO$_2$ film 108 exhibits flowability, and can be planarized to a considerable extent.

Then, as shown in FIG. 1G, the SiO$_2$ film 108 is polished by a CMP method (chemical mechanical polishing method) to planarize its surface. At this time, same portions of the SiO$_2$ film 105 and the F-containing SiO$_2$ film 107 which have been formed before are eliminated by polishing. The planarizing by the CMP method should be carried out not to eliminate the whole SiO$_2$ film 105 formed in a convexity 103a of the aluminum wiring layer.

Subsequently, as shown in FIG. 1H, an SiO$_2$ film 109 (cover insulating film) is formed on the planarized surface. This SiO$_2$ film 109 is formed by a plasma enhanced CVD method, and SiH$_4$ and N$_2$O are used as source gases. A film thickness of the SiO$_2$ film 109 is 100 nm.

The foregoing process of forming the SiO$_2$ films 105 (underlying insulating film) and 109 (cover insulating film), and the F-containing SiO$_2$ film 107 results in formation, on the object 104 to be formed, an interlayer insulating film of a low dielectric constant, which has good heat resistivity and moisture absorption resistance. That is, since the F-containing SiO$_2$ film 107 has porosity, a relative dielectric constant thereof is smaller than that of a usual SiO$_2$ film. Also, since the usual SiO$_2$ film 109 is formed on the porous F-containing SiO$_2$ film 107, incursion of water into the F-containing SiO$_2$ film 107 can be prevented. Furthermore, performing the H plasma treatment for the SiO$_2$ film 107 can improve the moisture absorption resistance of the film. Moreover, the SiO$_2$ films 105 and 109, and the F-containing SiO$_2$ film 107 have better heat resistivity compared with the organic insulating film since these films consist mainly of Si and O.

Twelfth Embodiment

A twelfth embodiment is case of applying the eleventh embodiment to a damascene process.

FIGS. 2A to 2M are cross-sectional views illustrating the twelfth embodiment.

First, as shown in FIG. 2A, a BPSG (borophosphosilicate glass) film 202 is formed on a silicon substrate 201. Then, after an aluminum layer is formed thereon, patterning is performed for the same to form an aluminum wiring layer 203. It should be noted that the aluminum wiring layer 203 in figures is not patterned for convenience. The silicon substrate 201, the BPSG film 202 and the aluminum wiring layer 203 constituted an object 204 to be formed.

As shown in FIG. 2B, an SiO$_2$ film 205 (underlying insulating film) having a film thickness of 100 nm is formed on the aluminum wiring layer 203. This SiO$_2$ film 205 is formed by a plasma enhanced CVD method (plasma enhanced chemical vapor deposition method), and SiH$_4$ and N$_2$O are used as source gases.

Subsequently, as shown in FIG. 2C, an Si—C—F (—H) film 206 is formed on the SiO$_2$ film 205 (underlying insulating film). This Si—C—F (—H) film 206 is formed by using TEOS (Tetra-Ethyl-Ortho-Silicate) and C$_2$F$_6$ as source gases, applying an RF power having a frequency of 13.56 MHz and a power of 100 W while keeping the silicon substrate 201 at 100°, and performing plasma polymerization for TEOS and C$_2$F$_6$ at pressure of 1 Torr. Flow rates of source gases at this time are 30 sccm and 5 sccm for TEOS and C$_2$F$_6$ respectively. A film thickness of the Si—C—F (—H) film 206 is 500 nm.

It should be noted that in forming the Si—C—F (—H) film 206, metylsilane (Si(CH$_3$)H$_3$) can also be used instead of the TEOS. When using the metylsilane, its flow rate is 30 sccm and the other process conditions are the same as in the case using the TEOS.

Then, as shown in FIG. 2D, O (oxygen) plasma treatment is performed for the Si—C—F (—H) film 206. This O (oxygen) plasma treatment is performed supplying 600 sccm O$_2$ to a chamber (not shown) and applying RF power having frequency of 400 kHz and power of 300 W to the O$_2$. The time for the O (oxygen) plasma treatment is 360 sec, and the temperature of the silicon substrate 201 is maintained at 350° C. during undergoing the O (oxygen) plasma treatment.

In this O (oxygen) plasma treatment C or H contained in the Si—C—F (—H) film 206 is oxidized, and discharged to the outside of the film. Voids are formed in portions, from which C or H has been discharged, and Si—O bond is formed on the portion. Accordingly, the Si—C—F (—H) film 206 becomes a porous F-containing SiO$_2$ film 207.

Subsequently, as shown in FIG. 2E, H (hydrogen) plasma treatment is performed for the porous F-containing SiO$_2$ film 207.

This H plasma treatment is performed by supplying H$_2$ of 600 sccm to a chamber (not shown) and applying RF power to upper and lower electrodes (not shown) that is opposing each other in the chamber. And the RF power applied to the upper electrode has frequency of 13.56 MHz and power of 50 W. On the other hand, the RF power applied to the lower electrode has frequency of 400 kHz and power of 400 W. Further, during undergoing the H plasma treatment, the pressure in the chamber is 0.1~0.2 Torr and the temperature of the silicon substrate 201 is maintained at 400° C. Still further, the time for the H plasma treatment is 60 sec.

The H plasma treatment substitutes Si—H bonds for dangling bonds of Si in an Si—O bond in the surface of the void. Therefore, OH radicals and water are made to be hard to bond to the dangling bonds of Si, which improves the moisture absorption resistance of the film.

Subsequently, as shown in FIG. 2F, patterning is performed for the F-containing SiO$_2$ film 207 to form a damascene trench 208. This damascene trench 208 reaches the SiO$_2$ film 205 formed below the F-containing SiO$_2$ film 207.

Then, as shown in FIG. 2G, an SiO$_2$ film 209 (first insulating film) is formed on the F-containing SiO$_2$ film 207 and on the side and bottom portions of the damascene trench 208. This SiO$_2$ film 209 is formed by a plasma enhanced CVD method, and SiH$_4$ and N$_2$O are used as source gases. By the SiO$_2$ film 209 formed on the side portion of the damascene trench 208, Cu buried later in the damascene trench 208 can be prevented from being dispersed in the porous B-containing SiO$_2$ film 207.

Then, as shown in FIG. 2H, anisotropic etching is performed for the SiO$_2$ film 209 (first insulating film) and the SiO$_2$ film 205 (underlying insulating film) formed below the damascene trench 208. Accordingly, the SiO$_2$ film 209 is eliminated except for a portion formed on the side portion of the damascene trench 208. Also, since the SiO$_2$ film 205 formed below the damascene trench 208 is eliminated, a contact hole that reaches the aluminum wiring layer 203 is formed below the damascene trench 208.

Subsequently, as shown in FIG. 2I, a Cu-plated film 210 is formed in the damascene trench 208 and on the F-containing SiO$_2$ film 207. The Cu-plated film 210 formed in the damascene trench 208 is used as a Cu wiring line.

Then, as shown in FIG. 2J, the Cu-plated film 210 formed on the F-containing SiO$_2$ film 207 is polished by a CMP method to be eliminated. Accordingly, the Cu-plated film remains only in the damascene trench 208.

Subsequently, as shown in FIG. 2K, a barrier TiN film 211 is formed above the damascene trench 208. Accordingly, Cu in the damascene trench 208 can be prevented from being dispersed in an $SiO_2$ film formed later above the damascene trench 208.

Then, as shown in FIG. 2L, patterning is performed to leave a TiN film 211*a* formed above the damascene trench 208, and the TiN film 211 formed in the other portions is etched to be eliminated.

Subsequently, as shown in FIG. 2M, an $SiO_2$ film 212 (cover insulating film) is formed on the F-containing $SiO_2$ film 207 and the TiN film 211*a*. This $SiO_2$ film 212 is formed by a plasma enhanced CVD method, and $SiH_4$ and $N_2O$ are used as source gases.

The foregoing process results in formation, on the object 204 to be formed, an interlayer insulating film of a low dielectric constant, which has good heat resistivity and moisture absorption resistance. That is, since the F-containing $SiO_2$ film 207 has porosity, a relative dielectric constant thereof is smaller than that of a usual $SiO_2$ film. Also, since the usual $SiO_2$ film 212 (cover insulating film) is formed on the porous F-containing $SiO_2$ film 207, incursion of water into the F-containing $SiO_2$ film 207 can be prevented. Furthermore, performing the H plasma treatment for the $SiO_2$ film 207 can improve the moisture absorption resistance of the film. Moreover, the F-containing $SiO_2$ film 207 and the $SiO_2$ film 212 have better heat resistivity compared with the organic insulating film since these films consist many of Si and O.

Thirteenth Embodiment

In a thirteenth diet, a film containing carbon, fluorine and oxygen, or a film containing carbon, fluorine, oxygen and hydrogen (referred to as Si—C—F—O (—H) film, hereinafter) is formed in order to form a porous F-containing $SiO_2$ film.

FIGS. 1A to 1H are cross-sectional views illustrating the thirteenth embodiment.

First, as shown in FIG. 1A, a BPSG (borophosilicate glass) film 102 is formed on a silicon substrate 101. Then, after an aluminum film is formed on the BPSG film 102, patterning is performed for the same to form an aluminum wiring layer 103. The silicon substrate 101, the BPSG film 102 and the aluminum wiring layer 103 formed in this manner constitute an object 104 to be formed.

Then, as shown in FIG. 1B, an $SiO_2$ film 105 (underlying insulating film) is formed on the object 104 to be formed. This $SiO_2$ film 105 is formed by a plasma enhanced CVD method (plasma enhanced chemical vapor deposition method), and $SiH_4$ and $N_2O$ are used as source gases. A film thickness of the $SiO_2$ film 105 is 100 nm. The $SiO_2$ film 105 can prevent $H_2O$ from being dispersed in the aluminum wiring layer 103, which may cause corrosion.

Subsequently, as shown in FIG. 1C, an Si—C—F—O (—H) film 106 is formed on the $SiO_2$ film 105 (underlying insulating film). This Si—C—F—O (—H) film 106 is formed by performing plasma polymerization for TEOS, $C_2F_6$ and $O_2$. This plasma polymerization is performed by applying an RF power having frequency of 13.56 MHz and power of 100 W to the TEOS, $C_2F_6$ and $O_2$. And the flow rates of source gases at this time are 30 sccm, 5 sccm and 260 sccm for TEOS, $C_2F_6$ and $O_2$ respectively.

In forming the Si—C—F—O (—H) film 106 the temperature of the silicon substrate 101 is maintained at 400° C. and the pressure is held at 1 Torr. A film thickness of the Si—C—F—O (—H) film 106 is 500 nm.

It should be noted that in forming the Si—C—F—O (—H) film 106, metylsilane ($Si(CH_3)H_3$) can also be used instead of the TEOS. When using the metylsilane, its flow rate is 30 sccm and the other process conditions are the same as in the case using the TEOS.

Then, as shown in FIG. 1D, O (oxygen) plasma treatment is performed for the Si—C—F—O (—H) film 106. This O (oxygen) plasma treatment is performed supplying 600 sccm $O_2$ to a chamber (not shown) and applying RF power having frequency of 400 kHz and power of 300 W to the $O_2$. The time for the O (oxygen) plasma treatment is 360 sec, and the temperature of the silicon substrate 101 is maintained at 350° C. during undergoing the O (oxygen) plasma treatment.

In this O (oxygen) plasma treatment C or H contained in the Si—C—F—O (—H) film 106 is oxidized and discharged to the outside of the film. Voids are formed in portions, from which C or H has been discharged, and Si—O bond is formed on the portion. Accordingly, the Si—C—F—O (—H) film 106 becomes a porous F-containing $SiO_2$ film 107.

Subsequently, as shown in FIG. 1E, H (hydrogen) plasma treatment is performed for the porous F-containing $SiO_2$ film 107.

This H plasma treatment is performed by supplying $H_2$ of 600 sccm to a chamber (not shown) and applying RF power to upper and lower electrodes (not shown) that is opposing each other in the chamber. And the RF power applied to the upper electrode has frequency of 13.56 MHz and power of 50 W. On the other hand, the RF power applied to the lower electrode has frequency of 400 kHz and power of 400 W. Further, during undergoing the H plasma treatment, the pressure in the chamber is 0.1~0.2 Torr and the temperature of the silicon substrate 101 is maintained at 400° C. Still further, the time for the H plasma treatment is 60 sec.

The H plasma treatment substitutes Si—H bonds for dangling bonds of Si in an Si—O bond in the surface of the void. Therefore, OH radicals and water are made to be hard to bond to the dangling bonds of Si, which improves the moisture absorption resistance of the film.

Accordingly, Si—H bond is substituted for Si dangling bond in the Si—O bond on the surface of the void, and moisture absorption resistance of the film can be increased.

Subsequently, as shown in FIG. 1F, an $SiO_2$ film 108 is formed on the porous F-containing $SiO_2$ film 107. This $SiO_2$ film 108 is formed by a CVD method, which contains TEOS and $O_3$ as source gases. In this case, since $O_3$ in source gas has concentration enough for oxidation of TEOS, the $SiO_2$ film 108 exhibits flowability, and can be planarized to a considerable extent.

Then, as shown in FIG. 1G, the $SiO_2$ film 108 is polished by a CMP method (chemical mechanical polishing method) to planarize its surface. At this time, some portions of the $SiO_2$ film 105 and the F-containing $SiO_2$ film 107 which have been formed before are eliminated by polishing. The planarizing by the CMP method should be carried out not to eliminate the whole $SiO_2$ film 105 formed on a convexity 103*a* of the aluminum wiring layer.

Subsequently, as shown in FIG. 1H, an $SiO_2$ film (cover insulating film) is formed on the planarized surface. This $SiO_2$ film 109 is formed by a plasma enhanced CVD method, and $SiH_4$ and $N_2O$ are used as source gases. A film thickness of the $SiO_2$ film 109 is 100 nm.

The foregoing process of forming the $SiO_2$ films 105 (underlying insulating film) and 109 (cover insulating film), and the F-containing $SiO_2$ film 107 results in formation, on the object 104 to be formed, an interlayer insulating film of a low dielectric constant, which has good heat resistivity and moisture absorption resistance. That is, since the F-containing $SiO_2$ film 107 has porosity, a relative dielectric constant thereof is smaller than that of a usual $SiO_2$ film. Also, since the usual $SiO_2$ film 109 is formed on the porous F-containing $SiO_2$ film 107, incursion of water into the F-containing $SiO_2$ film 107 can be prevented. Furthermore, performing the H plasma treatment for the $SiO_2$ film 107 can improve the moisture absorption resistance of the film. Moreover, the $SiO_2$ films 105 and 109 and the F-containing $SiO_2$ film 107 have better heat resistivity compared with the organic insulating film since these films consist mainly of Si and O.

Fourteenth Embodiment

A fourteenth embodiment is a case of applying the thirteenth embodiment to a damascene process.

FIGS. 2A to 2M are cross-sectional views illustrating the fourteenth embodiment.

First, as shown in FIG. 2A, a BPSG (borophosphosilicate glass) film 202 is formed on a silicon substrate 201. Then, after an aluminum layer is formed thereon, patterning is performed for the same to form an aluminum wiring layer 203. It should be noted that the aluminum wiring layer 203 in figures is not patterned for convenience. The silicon substrate 201, the BPSG film 202 and the aluminum wiring layer 203 constitute an object 204 to be formed.

As shown in FIG. 2B, an $SiO_2$ film 205 (underlying insulating film) having a film thickness of 100 nm is formed on the aluminum wiring layer 203. This $SiO_2$ film 205 is formed by a plasma enhanced CVD method (plasma enhanced chemical vapor deposition method), and $SiH_4$ and $N_2O$ are used as source gases.

Subsequently, as shown in FIG. 2C, an Si—C—F—O (—H) film 206 is formed on the $SiO_2$ film 205 (underlying insulating film). This Si—C—F—O (—H) film 206 is formed by using TEOS (Tetra-Ethyl-Ortho-Silicate), $C_2F_6$ and $O_2$ as source gases, and performing plasma polymerization for these source gases. This plasma polymerization is performed by applying an RF power having frequency of 13.56 MHz and power of 100 W to the TEOS, $C_2F_6$ and $O_2$. And the flow rates of source gases at this time are 30 sccm, 5 sccm and 260 sccm for TEOS, $C_2F_6$ and $O_2$ respectively.

In forming the Si—C—F—O (—H) film 206 the temperature of the silicon substrate 201 is maintained at 400° C. and the pressure is held at 1 Torr. A film thickness of the Si—C—F—O (—H) film 206 is 500 nm.

It should be noted that in forming the Si—C—F—O (—H) film 206, metylsilane ($Si(CH_3)H_3$) can also be used instead of the TEOS. When using the metylsilane, its flow rate is 30 sccm and the other process conditions are the same as in the case using the TEOS.

Then, as shown in FIG. 2D, O (oxygen) plasma treatment is performed for the Si—C—F—O (—H) film 206. This O (oxygen) plasma treatment is performed supplying 600 sccm $O_2$ to a chamber (not shown) and applying RF power having frequency of 400 kHz and power of 300 W to the $O_2$. The time for the O (oxygen) plasma treatment is 360 sec, and the temperature of the silicon substrate 201 is maintained at 350° C. during undergoing the O (oxygen) plasma treatment.

In this O (oxygen) plasma treatment C or H contained in the Si—C—F—O (—H) film 206 is oxidized and discharged to the outside of the film. Voids are formed in portions, from which C or H has been discharged, and Si—O bond is formed on the portion. Accordingly, the Si—C—F—O (—H) film 206 becomes a porous F-containing $SiO_2$ film 207.

Subsequently, as shown in FIG. 2E, H (hydrogen) plasma treatment is performed for the porous F-containing $SiO_2$ film 207.

This H plasma treatment is performed by supplying $H_2$ of 600 sccm to a chamber (not shown) and applying RF power to upper and lower electrodes (not shown) that is opposing each other in the chamber. And the RF power applied to the upper electrode has frequency of 13.56 MHz and power of 50 W. On the other hand, the RF power applied to the lower electrode has frequency of 400 kHz and power of 400 W. Further, during undergoing the H plasma treatment, the pressure in the chamber is 0.1~0.2 Torr and the temperature of the silicon substrate 101 is maintained at 400° C. Still further, the time for the H plasma treatment is 60 sec.

The H plasma treatment substitutes Si—H bonds for dangling bonds of Si in an Si—O bond in the surface of the void. Therefore, OH radicals and water are made to be hard to bond to the dangling bonds of Si, which improves the moisture absorption resistance of the film.

Subsequently, as shown in FIG. 2F, patterning is performed for the B-containing $SiO_2$ film 207 to form a damascene trench 208. This damascene trench 208 reaches the $SiO_2$ film 205 formed below the F-containing $SiO_2$ film 207.

Then, as shown in FIG. 2G, an $SiO_2$ film 209 (first insulating film) is formed on the F-containing $SiO_2$ film 207 and on the side and bottom portions of the damascene trench 208. This $SiO_2$ film 209 is formed by a plasma enhanced CVD method, and $SiH_4$ and $N_2O$ are used as source gases. By the $SiO_2$ film 209 formed on the side portion of the damascene trench 208, Cu buried later in the damascene trench 208 can be prevented from being dispersed in the porous B-containing $SiO_2$ film 207.

Then, as shown in FIG. 2H, anisotropic etching is performed for the $SiO_2$ film 209 and the $SiO_2$ film 205 (underlying insulating film) formed below the damascene trench 208. Accordingly, the $SiO_2$ film 209 is eliminated except for a portion formed on the side portion of the damascene trench 208. Also, since the $SiO_2$ film 205 formed below the damascene trench 208 is eliminated, a contact hole that reaches the aluminum wiring layer 203 is formed below the damascene trench 208.

Subsequently, as shown in FIG. 2I, a Cu-plated film 210 is formed in the damascene trench 208 and on the B-containing $SiO_2$ film 207. The Cu-plated film 210 formed in the damascene trench 208 is used as a Cu wiring line.

Then, as shown in FIG. 2J, the Cu-plated film 210 formed on the F-containing $SiO_2$ film 207 is polished by a CMP method to be eliminated. Accordingly, the Cu-plated film remains only in the damascene trench 208.

Subsequently, as shown in FIG. 2K, a barrier metal TiN film 211 is formed above the damascene trench 208. Accordingly, Cu in the damascene trench 208 can be prevented from being dispersed in an $SiO_2$ film formed later above the same.

Then, as shown in FIG. 2L, patterning is performed to leave a TiN film 211a formed above the damascene trench 208, and the TiN film 211 formed on the other portions is etched to be eliminated.

Subsequently, as shown in FIG. 2M, an $SiO_2$ film 212 (cover insulating film) is formed on the F-containing $SiO_2$ film 207 and the TiN film 211a. This $SiO_2$ film 212 is formed by a plasma enhanced CVD method, and $SiH_4$ and $N_2O$ are used as source gases.

The foregoing process results in formation, on the object 204 to be formed, an interlayer insulating film of a low dielectric constant, which has good heat resistivity and moisture absorption resistance. That is, since the F-containing $SiO_2$ film 207 has porosity, a relative dielectric constant thereof is smaller than that of a usual $SiO_2$ film. Also, since the usual $SiO_2$ film 212 (cover insulating film) is formed on the porous F-containing $SiO_2$ film 207, incursion of water into the $SiO_2$ film 207 can be prevented. Furthermore, performing the H plasma treatment for the $SiO_2$ film 107 can improve the moisture absorption resistance of the film. Moreover, the F-containing $SiO_2$ film 207 and the $SiO_2$ film 212 have better heat resistivity compared with the organic insulating film since these films consist mainly of Si and O.

What is claimed is:

1. A method for forming a porous $SiO_2$ interlayer insulating film comprising the steps of:
    applying RF power to a source gas that contains a first compound containing silicon and at least one element selected from the group consisting of carbon and hydrogen, to form a film on a substrate, said film containing silicon and at least one element selected from the group consisting of carbon and hydrogen; and
    oxidizing said film to oxidize and discharge from said film at least one element selected from the group consisting of said carbon and said hydrogen contained in said film, said discharge forming voids in said film and converting said film to the porous $SiO_2$ insulating film.

2. The method according to claim 1, wherein said source gas further contains $O_2$.

3. The method according to claim 1, wherein said source gas further contains $H_2O$.

4. The method according to claim 1, wherein said source gas further contains a second compound containing boron and hydrogen and said porous $SiO_2$ film contains boron.

5. The method according to claim 4, wherein said source gas further contains $O_2$.

6. The method according to claim 4, wherein said source gas further contains $H_2O$.

7. The method according to claim 1, wherein said source gas further contains a second compound containing fluorine and said porous $SiO_2$ film contains fluorine.

8. The method according to claim 7, wherein said source gas further contains $O_2$.

9. The method according to claim 7, wherein said source gas further contains $H_2O$.

10. The method according to claim 1, wherein said first compound is a compound selected from the group consisting of TEOS, $SiH_4$, methylsilane($Si(CH_3)_3H_3$) and trimethyl-siliruborate ($\{(CH_3)_3SiO\}_3B$).

11. The method according to claim 4, wherein said second compound is a compound selected from the group consisting of $B_2H_6$, TMB($B(OCH_3)_3$) and TEB($B(OC_2H_5)_3$).

12. The method according to claim 7, wherein said second compound is $C_2F_6$.

13. The method according to claim 1, wherein an inert gas is added to said source gas.

14. The method according to claim 1, wherein said oxidizing is performed by oxygen plasma.

15. The method according to claim 1, further comprising the step of:
    bringing a hydrogen plasma into contact with said porous $SiO_2$ film.

16. The method according to claim 1, wherein an underlying insulating film is formed on said substrate, and said porous $SiO_2$ film is formed on said underlying insulating film.

17. The method according to claim 1, further comprising the steps of:
    forming a damascene trench in said porous $SiO_2$ film;
    forming a side-wall insulating film on a side portion of said damascene trench;
    burying a metallic film in said damascene trench; and
    forming a barrier metal film on said metallic film.

18. The method according to claim 17, wherein said side-wall insulating film is formed by forming a first insulating film on said porous $SiO_2$ film and on side and bottom portions of said damascene trench, and etching said first insulating film anisotropically to leave said first insulating film on said side portion of said damascene trench and to remove said first insulating film from said bottom portion of said damascene trench.

19. The method according to claim 1, further comprising the step of:
    forming a cover insulating film on said porous $SiO_2$ film.

* * * * *